US008497521B2

(12) United States Patent
Ushiyama et al.

(10) Patent No.: US 8,497,521 B2
(45) Date of Patent: Jul. 30, 2013

(54) LED PACKAGE

(75) Inventors: Naoya Ushiyama, Fukuoka-ken (JP);
Kazuhisa Iwashita, Fukuoka-ken (JP);
Tatsuo Tonedachi, Fukuoka-ken (JP);
Teruo Takeuchi, Fukuoka-ken (JP);
Hiroaki Oshio, Fukuoka-ken (JP);
Tetsuro Komatsu, Fukuoka-ken (JP);
Gen Watari, Fukuoka-ken (JP); Satoshi Shimizu, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 302 days.

(21) Appl. No.: 12/875,566

(22) Filed: Sep. 3, 2010

(65) Prior Publication Data

US 2011/0186901 A1 Aug. 4, 2011

(30) Foreign Application Priority Data

Jan. 29, 2010 (JP) .................. 2010-019778
May 24, 2010 (JP) .................. 2010-118668

(51) Int. Cl.
*H01L 33/00* (2010.01)
(52) U.S. Cl.
USPC .................... 257/99; 257/E33.066
(58) Field of Classification Search
USPC ............................ 257/99, E33.066
See application file for complete search history.

(56) References Cited

U.S. PATENT DOCUMENTS

| 8,093,619 B2 * | 1/2012 | Hayashi ................ 257/99 |
| 8,242,519 B2 * | 8/2012 | Tsang et al. ........... 257/89 |
| 2002/0190262 A1 * | 12/2002 | Nitta et al. ............ 257/99 |
| 2007/0108436 A1 * | 5/2007 | Sanmyo ................. 257/13 |
| 2008/0197510 A1 | 8/2008 | Mii et al. |

(Continued)

FOREIGN PATENT DOCUMENTS

| CN | 1679179 A | 5/2005 |
| JP | 2000012911 | 1/2000 |

(Continued)

OTHER PUBLICATIONS

Japanese Office Action for Application No. 2010-118668 mailed on Jul. 15, 2011.

(Continued)

*Primary Examiner* — Benjamin Sandvik
(74) *Attorney, Agent, or Firm* — Turocy & Watson, LLP

(57) ABSTRACT

According to one embodiment, an LED package includes a first lead frame, a second lead frame, an LED chip, a wire, and a resin body. The first lead frame and the second lead frame are arranged with a space between each other. The LED chip is provided above the first lead frame and the second lead frame. The LED chip has a first terminal connected to the first lead frame and a second terminal connected to the second lead frame. The wire connects the first terminal to the first lead frame. The resin body covers the LED chip as well as a top surface, a part of a bottom surface, and a part of an edge surface of each of the first lead frame and the second lead frame. A remaining portion of each of the bottom surfaces and a remaining portion of each of the edge surfaces are exposed. A chip side angle formed by a top surface of the LED chip and a direction in which the wire is extracted from the first terminal is smaller than a frame side angle formed by the top surface of the first lead frame and a direction in which the wire is extracted from the first lead frame.

11 Claims, 29 Drawing Sheets

U.S. PATENT DOCUMENTS

| | | | |
|---|---|---|---|
| 2008/0237627 A1* | 10/2008 | Kobayakawa | 257/99 |
| 2010/0163920 A1 | 7/2010 | Itai | |
| 2010/0314654 A1* | 12/2010 | Hayashi | 257/99 |
| 2012/0126256 A1* | 5/2012 | Komatsu et al. | 257/88 |

FOREIGN PATENT DOCUMENTS

| | | |
|---|---|---|
| JP | 2001274463 | 10/2001 |
| JP | 2003110080 | 4/2003 |
| JP | 2003110145 | 4/2003 |
| JP | 2003347345 | 12/2003 |
| JP | 2004247612 | 9/2004 |
| JP | 2004274027 | 9/2004 |
| JP | 2006093672 | 4/2006 |
| JP | 2006114879 | 4/2006 |
| JP | 2006147622 | 6/2006 |
| JP | 2006-203080 | 8/2006 |
| JP | 2007027281 | 2/2007 |
| JP | 2007095797 | 4/2007 |
| JP | 2007258325 | 4/2007 |
| JP | 2007150315 | 6/2007 |
| JP | 2007036019 | 8/2007 |
| JP | 2007281250 | 10/2007 |
| JP | 2007288198 | 11/2007 |
| JP | 2008112966 | 5/2008 |
| JP | 2008218469 | 9/2008 |
| JP | 2008153043 | 12/2008 |
| JP | 1375900 | 12/2009 |
| JP | 1375901 | 12/2009 |
| WO | 2008123232 | 10/2008 |
| WO | 2009/072757 A2 | 11/2009 |

OTHER PUBLICATIONS

Japanese Office Action Mailed Oct. 12, 2010 for Patent Application No. 2010-118668.

Japanese Office Action dated Feb. 22, 2011 corresponding to U.S. Appl. No. 12/875,566, filed Sep. 3, 2010.

Chinese Office Action for Chinese Application No. 201010277998.1 mailed on Aug. 6, 2012.

Chinese Office Action for Chinese Application No. 201010277998.1 mailed on Dec. 14, 2012.

* cited by examiner

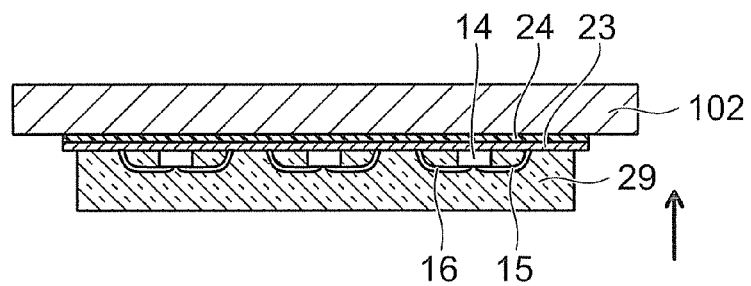
FIG. 6A
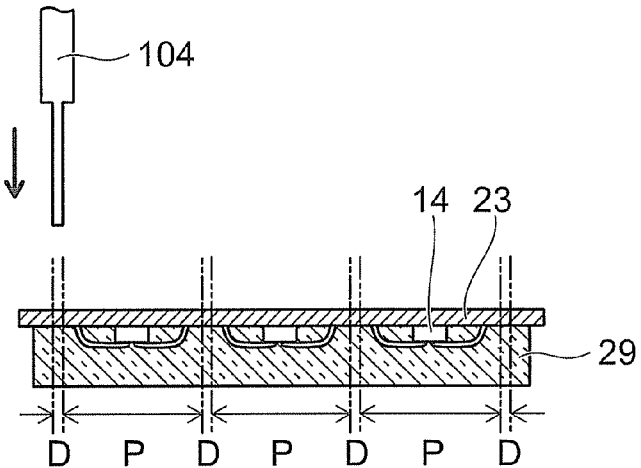
FIG. 6B

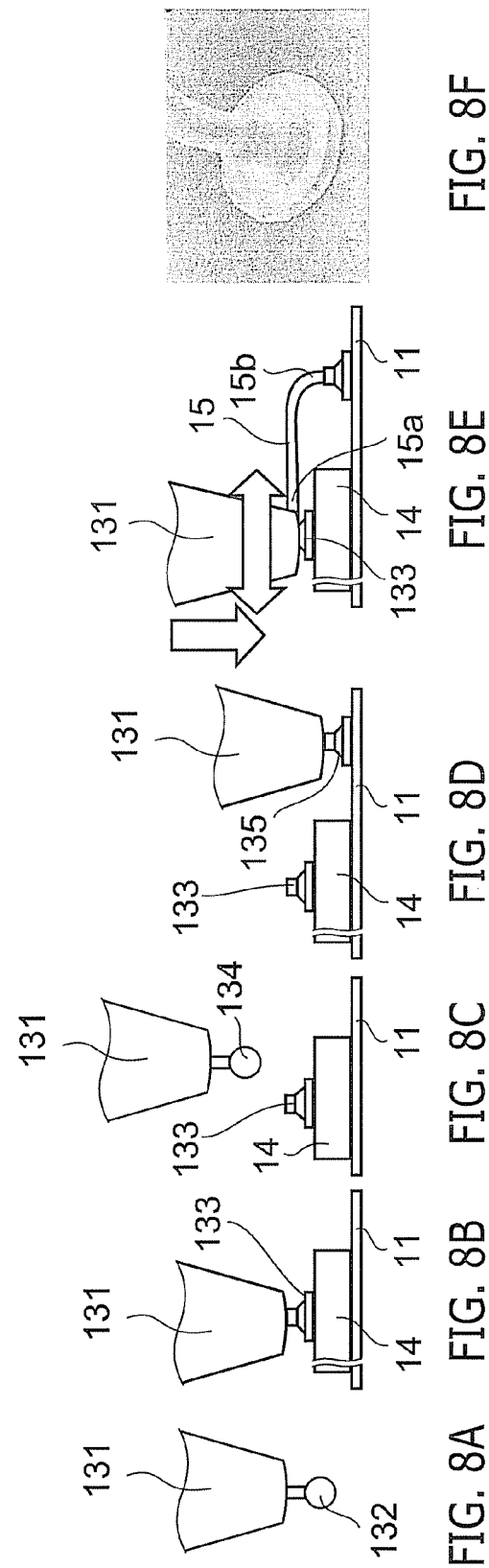

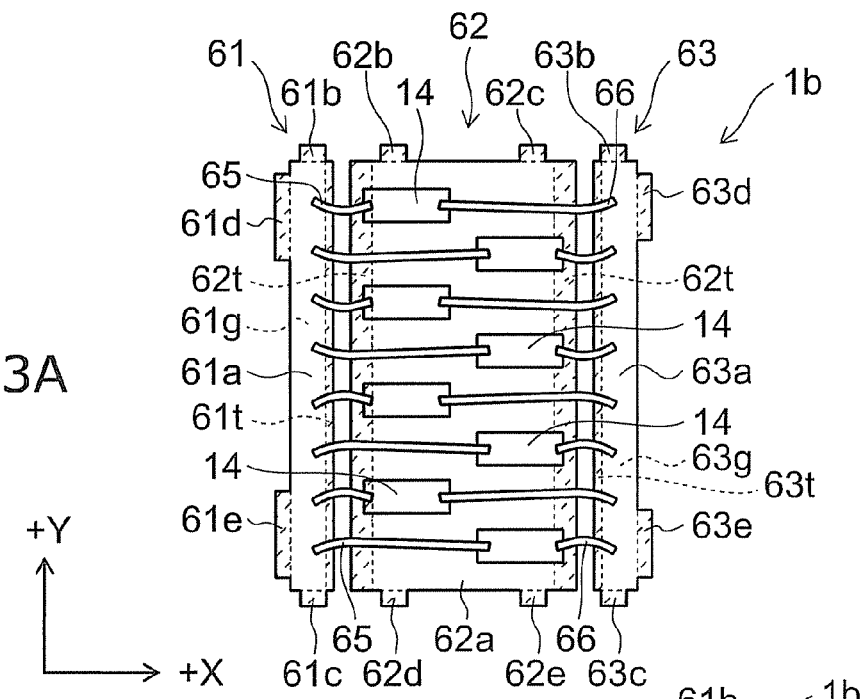
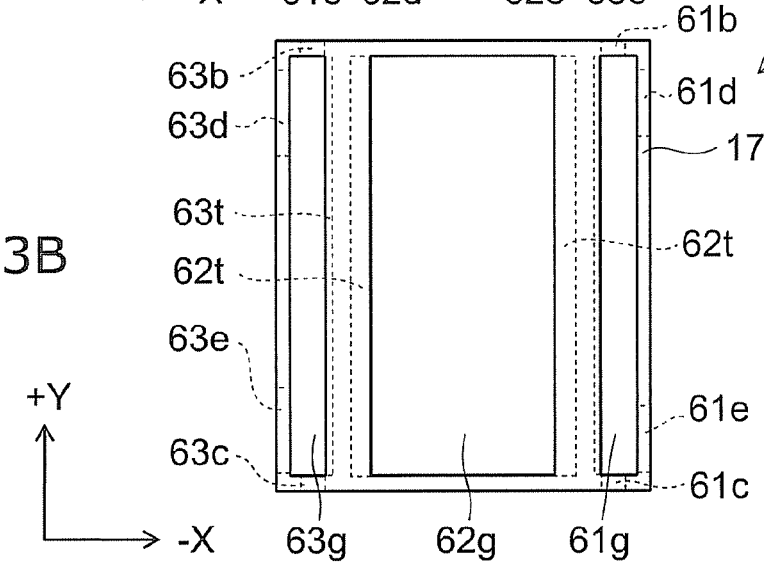
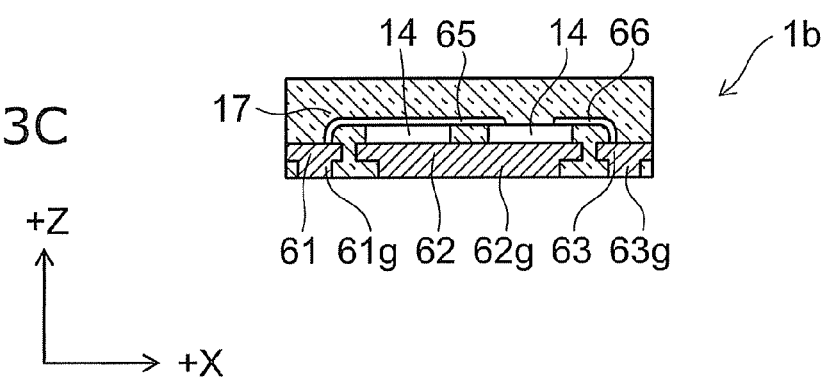
FIG. 13A
FIG. 13B
FIG. 13C

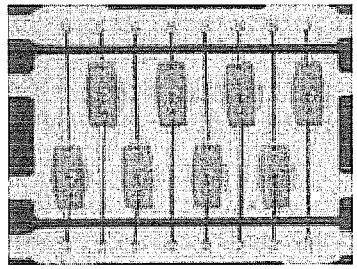
FIG. 15A
NORMAL BONDING,
STRAIGHT LINE SHAPE
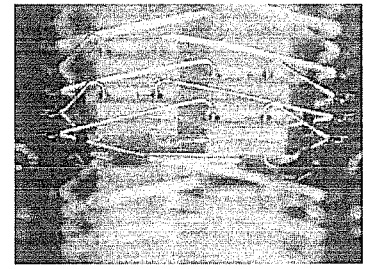
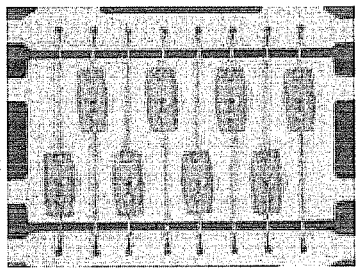
FIG. 15B
REVERSE BONDING,
STRAIGHT LINE SHAPE
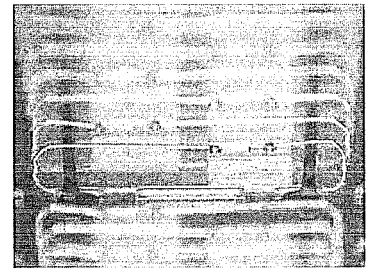
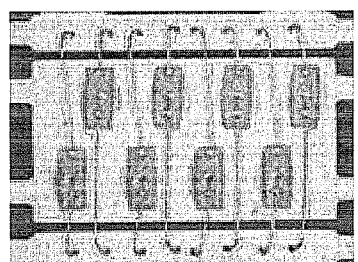
FIG. 15C
REVERSE BONDING,
OUTER CURVATURE
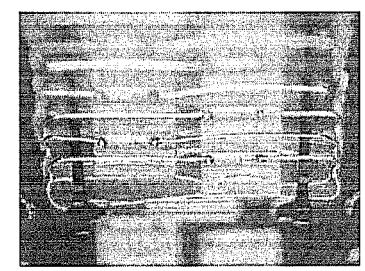
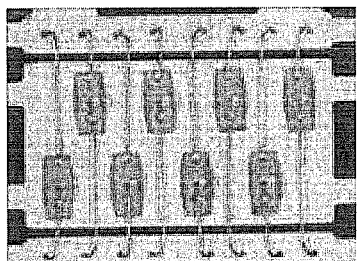
FIG. 15D
REVERSE BONDING,
INNER CURVATURE
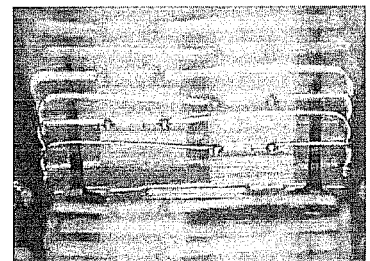

LED PACKAGE

CROSS-REFERENCE TO RELATED APPLICATIONS

This application is based upon and claims the benefit of priority from the prior Japanese Patent Application No. 2010-019778, filed on Jan. 29, 2010 and the prior Japanese Patent Application No. 2010-118668, filed on May 24, 2010; the entire contents of which are incorporated herein by reference.

FIELD

Embodiments described herein relate generally to an LED (Light Emitting Diode) package.

BACKGROUND

Heretofore, for the purpose of controlling light distribution characteristics and thereby increasing an extraction efficiency of light from an LED package in which an LED chip is mounted, a bowl-shaped envelope made of white resin has been provided in the LED package. In such an LED package, an LED chip is mounted on a bottom surface of the envelope, and then, transparent resin is filled in the envelope to bury the LED chip. Such an envelope is often formed of a polyamide-based thermoplastic resin (for instance, refer to JP-A 2004-274027 (Kokai)).

In recent years, along with expansion of the application range of LED packages, there has been a demand for LED packages to become more durable. Meanwhile, the amount of light and heat emitted from an LED chip increases along with an increase in an output power of the LED chip, which in turn, causes degradation of a resin portion sealing the LED chip to proceed easily. In addition, along with expansion of the application range of LED packages, a further cost-reduction has been demanded.

BRIEF DESCRIPTION OF THE DRAWINGS

FIGS. 6A and 6B are process cross-sectional views illustrating the manufacturing method of the LED package according to the first embodiment;

FIGS. 8A to 8F are diagrams illustrating a wire bonding method in the first embodiment;

FIG. 13A is a plane view illustrating lead frames, LED chips and wires of the LED package according to the third modification example of the first embodiment, FIG. 13B is a bottom surface view illustrating the LED package, and FIG. 13C is a cross-sectional view illustrating the LED package;

FIGS. 15A to 15D are photo images illustrating samples evaluated in Test Example 1;

DETAILED DESCRIPTION

In general, according to one embodiment, an LED package includes a first lead frame, a second lead frame, an LED chip, a wire, and a resin body. The first lead frame and the second lead frame are arranged with a space between each other. The LED chip is provided above the first lead frame and the second lead frame. The LED chip has a first terminal connected to the first lead frame and a second terminal connected to the second lead frame. The wire connects the first terminal to the first lead frame. The resin body covers the LED chip as well as a top surface, a part of a bottom surface, and a part of an edge surface of each of the first lead frame and the second lead frame. A remaining portion of each of the bottom surfaces and a remaining portion of each of the edge surfaces are exposed. A chip side angle formed by a top surface of the LED chip and a direction in which the wire is extracted from the first terminal is smaller than a frame side angle formed by the top surface of the first lead frame and a direction in which the wire is extracted from the first lead frame.

According to another embodiment, an LED package includes a first lead frame, a second lead frame, an LED chip, a wire, and a resin body. The first lead frame and the second lead frame are arranged with a space between each other. The LED chip is provided above the first lead frame and the second lead frame. The LED chip has a first terminal connected to the first lead frame and a second terminal connected to the second lead frame. The wire connects the first terminal to the first lead frame. The resin body covers the LED chip, the wire, and a part of each of the first lead frame and the second lead frame. A portion of the wire other than both ends of the wire is arranged at a position outside a region immediately above a straight line connecting the both ends of the wire.

According to yet another embodiment, an LED package includes a first lead frame, a second lead frame, an LED chip, and a resin body. The first lead frame and the second lead frame are arranged with a space between each other. The LED chip is provided above the first lead frame and the second lead frame. The LED chip has a first terminal connected to the first lead frame and a second terminal connected to the second lead frame. The resin body covers the LED chip as well as a top surface, a part of a bottom surface, and a part of an edge surface of each of the first lead frame and the second lead frame. A remaining portion of each of the bottom surfaces and a remaining portion of each of the edge surfaces are exposed. An area of a top surface of the resin body is smaller than an area of a bottom surface of the resin body.

Hereinafter, embodiments of the invention will be described with reference to the drawings.

To begin with, a first embodiment of the invention will be described.

Figure 1:
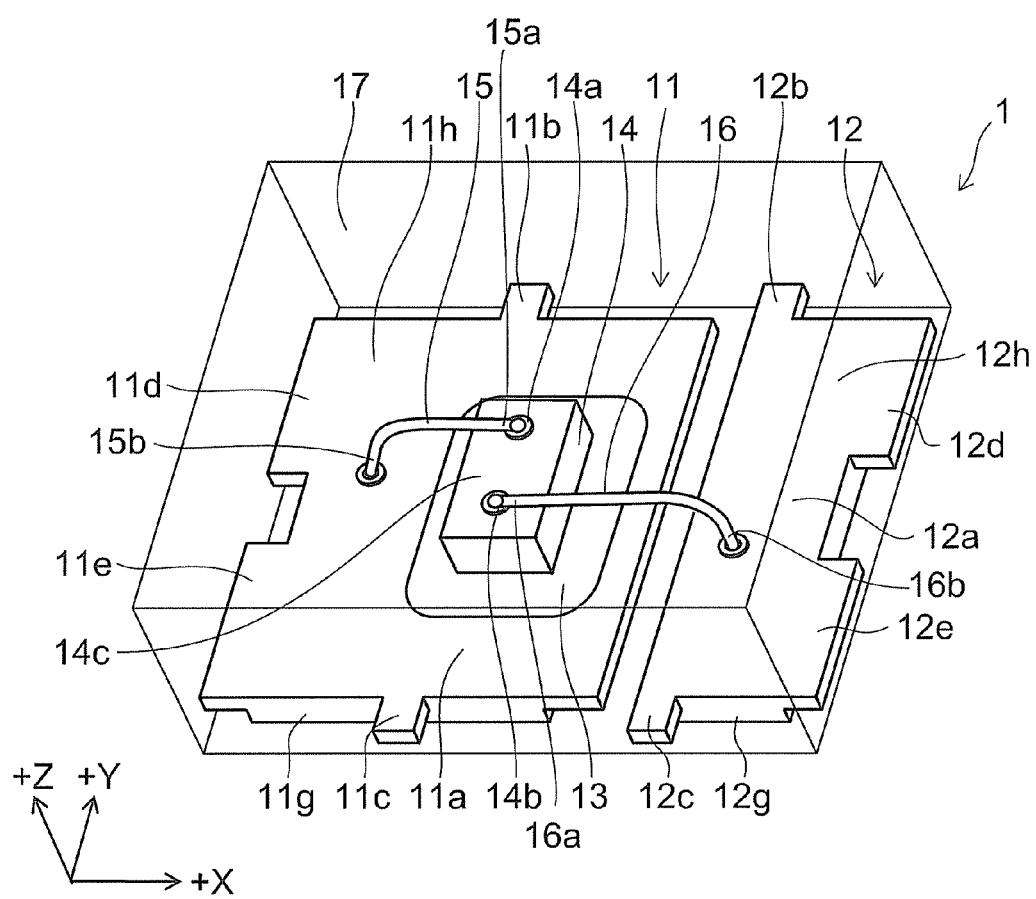
FIG. 1 is a perspective view illustrating an LED package according to a first embodiment.

FIG. 1 is a perspective view illustrating an LED package according to this embodiment.

Figure 2A:
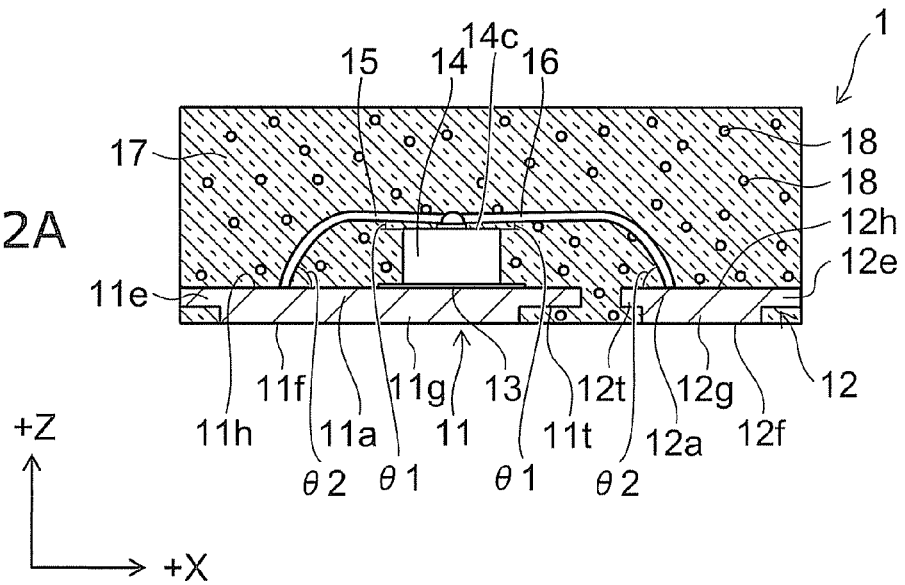
FIG. 2A is a cross-sectional view illustrating the LED package according to the first embodiment.
Figure 2B:
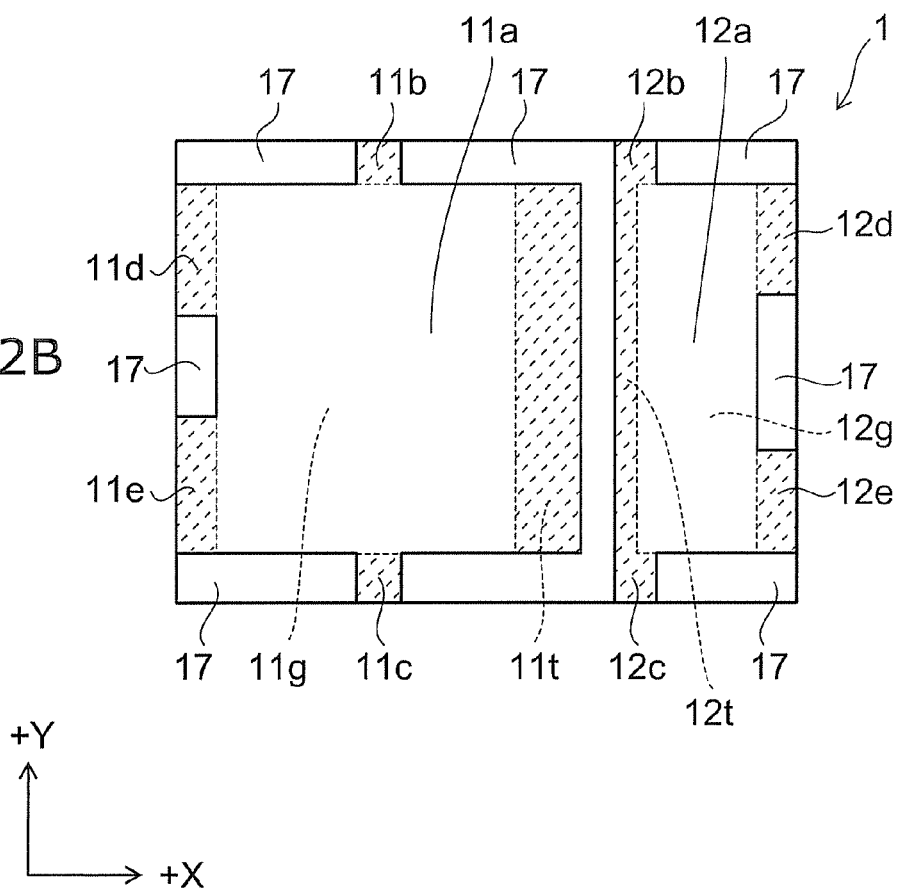
FIG. 2B is a plane view illustrating lead frames.

FIG. 2A is a cross-sectional view illustrating the LED package according to the embodiment, and FIG. 2B is a plane view illustrating lead frames.

As shown in FIG. 1 and FIGS. 2A and 2B, a pair of lead frames 11 and 12 is provided in an LED package 1 according to this embodiment. The shape of each of the lead frames 11 and 12 is a flat plate, and the lead frames 11 and 12 are arranged on the same plane with a space between each other. The lead frames 11 and 12 are made of the same conductive material, and each of the lead frames 11 and 12 is configured of a copper plate in such as way that silver-plated layers are formed respectively on the top and bottom surfaces of the copper plate, for example. Here, no silver-plated layer is formed on the edge surfaces of the lead frames 11 and 12. Thus, the copper plates are exposed on the edge surfaces of the lead frames 11 and 12, respectively.

Hereinafter, an XYZ orthogonal coordinate system is introduced in this description for the sake of convenience of explanation. Among directions in parallel with the top surfaces of the lead frames 11 and 12, the direction from the lead frame 11 toward the lead frame 12 is referred to as +X direction. In addition, among directions perpendicular to the top surfaces of the lead frames 11 and 12, an upward direction, i.e., the direction, as viewed from the lead frames, in which a later-described LED chip 14 is mounted is referred to as +Z direction. Moreover, among directions orthogonal to both +X direction and +Z direction, one of the directions is referred to as +Y direction. Note that, the directions opposite to +X, +Y and +Z directions are referred to as −X, −Y and −Z directions, respectively. In addition, "+X direction" and "−X direction" may be simply referred to as "X direction" in a collective manner, for example.

In the lead frame 11, a base portion 11a, which is rectangular when viewed from Z direction, is provided, and four extending portions 11b, 11c, 11d and 11e extend from the base portion 11a. The extending portion 11b extends in +Y direction from a center portion of an edge of the base portion 11a, the edge being positioned in X direction and facing in +Y direction. The extending portion 11c extends in −Y direction from a center portion of an edge of the base portion 11a, the edge being positioned in X direction and facing in −Y direction. The positions of the extending portions 11b and 11c in X direction are the same. The extending portions lid and 11e extend in −X direction respectively from both end portions of an edge of the base portion 11a, the edge facing in −X direction. As described above, the extending portions 11b to 11e extend from mutually different three sides of the base portion 11a.

The length of the lead frame 12 in X direction is short as compared with that of the lead frame 11 while the length of the lead frame 12 in Y direction is same as that of the lead frame 11. In the lead frame 12, a base portion 12a, which is rectangular when viewed from Z direction, is provided, and four extending portions 12b, 12c, 12d and 12e extend from the base portion 12a. The extending portion 12b extends in +Y direction from the end portion of an edge of the base portion 12a on −X direction side, the edge facing in +Y direction. The extending portion 12c extends in −Y direction from the end portion of an edge of the base portion 12a on −X direction side, the edge facing in −Y direction. The extending portions 12d and 12e extend in +X direction respectively from both end portions of an edge of the base portion 12a, the edge facing in +X direction. As described above, the extending portions 12b to 12e extend from mutually different three sides of the base portion 12a. The widths of the extending portions 11d and 11e of the lead frame 11 may be the same or different from those of the extending portions 12d and 12e of the lead frame 12. However, it makes it easier to distinguish between anode and cathode if the widths of the extending portions 11d and 11e are different from those of the extending portions 12d and 12e.

At a center portion of the base portion 11a in X direction on a bottom surface 11f of the lead frame 11, a projected portion 11g is formed. For this reason, the thickness of the lead frame 11 takes a two-level value. Thus, the center portion of the base portion 11a in X direction, i.e., the portion where the projected portion 11g is formed is relatively thick while both end portions of the base portion 11a in X direction and the extending portions 11b to 11e thereof are relatively thin. In FIG. 2B, a portion of the base portion 11a, where no projected portion 11g is formed is shown as a thin plate portion 11t. Likewise, a projected portion 12g is formed at a center portion of the base portion 12a in X direction on a bottom surface 12f of the lead frame 12. Thus, the thickness of the lead frame 12 also takes a two-level value, and the center portion of the base portion 12a in X direction, where the projected portion 12g is formed, is relatively thick while both end portions of the base portion 12a in X direction and the extending portions 12b to 12e thereof are relatively thin. In FIG. 2B, a portion of the base portion 12a, where no projected portion 12g is formed is shown as a thin plate portion 12t. In other words, notches are formed respectively at the bottom surfaces of both end portions of each of the base portions 11a and 12a in X direction, the notches extending in Y direction along the edges of each of the base portions 11a and 12a. Note that, in FIG. 2B, the relatively thin portions in the lead frames 11 and 12, i.e., the thin plate portions and the extending portions are shown by broken-line hatching.

The projected portions 11g and 12g are formed in the regions apart from edges of the lead frames 11 and 12, respectively, the edges facing each other. In addition, the regions including these edges are the thin plate portions 11t and 12t, respectively. A top surface 11h of the lead frame 11 and a top surface 12h of the lead frame 12 are flush with each other, and a bottom surface of the projected portion 11g of the lead frame 11 and a bottom surface of the projected portion 12g of the lead frame 12 are flush with each other. The position of the top surface of each of the extending portions in Z direction coincides with positions of the top surfaces of the lead frames 11 and 12. Accordingly, the extending portions are arranged on the same XY plane.

A die-mount material 13 is adhered to part of a region, which corresponds to the base portion 11a, of the top surface 11h of the lead frame 11. In this embodiment, the die-mount material 13 may be conductive or insulative. In a case where the die-mount material 13 is conductive, the die-mount material 13 is formed of silver paste, solder, eutectic solder or the like, for example. In a case where the die-mount material 13 is insulative, the die-mount material 13 is formed of transparent resin paste, for example.

The LED chip 14 is provided on the die-mount material 13. Specifically, the die-mount material causes the LED chip 14 to adhere to the lead frame 11, thereby mounting the LED chip 14 on the lead frame 11. The LED chip 14 is obtained by stacking a semiconductor layer made of gallium nitride (GaN) or the like on a sapphire substrate, for example. The shape of the LED chip 14 is a rectangular solid, for example, and terminals 14a and 14b are provided on the top surface of the LED chip 14. The LED chip 14 emits blue light, for example, when an electric voltage is supplied between the terminals 14a and 14b.

To the terminal 14a of the LED chip 14, an end 15a, which is one end of a wire 15, is bonded. Meanwhile, an end 15b, which is the other end of the wire 15, is bonded to the top surface 11h of the lead frame 11. Accordingly, the terminal 14a is connected to the lead frame 11 through the wire 15. Meanwhile, an end 16a, which is one end of a wire 16, is bonded to the terminal 14b. In addition, an end 16b, which is the other end of the wire 16, is bonded to the top surface 12h of the lead frame 12. Accordingly, the terminal 14b is connected to the lead frame 12 through the wire 16. The wires 15 and 16 are formed of metal such as gold or aluminum.

Further, in this embodiment, the end 15a of the wire 15 is extracted from the terminal 14a in an approximately horizontal direction (−X direction), and the end 15b is extracted from the top surface 11h in an approximately vertical direction (+Z direction). Specifically, an angle (chip side angle) θ1 formed by a top surface 14c (XY plane) of the LED chip 14 and the direction in which the wire 15 is extracted from the terminal 14a (approximately −X direction) is smaller than an angle (frame side angle) θ2 formed by the top surface 11h (XY plane) of the lead frame 11 and the direction in which the wire 15 is extracted from the lead frame 11 (approximately +Z direction). Likewise, the end 16a of the wire 16 is extracted from the terminal 14b in an approximately horizontal direction, and the end 16b is extracted from the top surface 12h of the lead frame 12 in an approximately vertical direction. Accordingly, in the case of the wire 16 as well, a chip side angle θ1 at which the end 16a is extracted from the terminal 14b is smaller than a frame side angle θ2 at which the end 16b is extracted from the lead frame 12. The chip side angle θ1 is preferably substantially between 0° and 5°, and the frame side angle θ2 is preferably substantially between 85° and 90°.

Moreover, a transparent resin body 17 is provided in the LED package 1. The transparent resin body 17 is formed of transparent resin such as silicone resin. Here, the term "transparent" also covers a translucent characteristic and implies a characteristic that allows at least a portion of light emitted from the LED chip 14 to transmit through the transparent resin. The outer shape of the transparent resin body 17 is a rectangular solid and covers the lead frames 11 and 12, the die-mount material 13, the LED chip 14, and the wires 15 and 16. The outer shape of the transparent resin body 17 corresponds to the outer shape of the LED package 1. A part of the lead frame 11 and a part of the lead frame 12 are exposed on the bottom surface and side surfaces of the transparent resin body 17. The thickness of the transparent resin body 17, i.e., the length thereof in Z direction is preferably smaller than five times of the thickness of the LED chip 14, and more preferably smaller than three times of the thickness of the LED chip 14. Meanwhile, the thickness of the transparent resin body 17 needs to be larger than a thickness obtained by adding the height of wire loop to the thicknesses of the lead frame 11 and the LED chip 14, in order to surely cover the apices of wire loops.

More specifically, the bottom surface of the projected portion 11g of the bottom surface 11f of the lead frame 11 is exposed on the bottom surface of the transparent resin body 17, and the tip edge surfaces of the extending portions 11b to 11e are exposed on respective side surfaces of the transparent resin body 17. Meanwhile, the entire portion of the top surface 11h of the lead frame 11, a region of the bottom surface 11f other than the projected portion 11g, the side surfaces of the projected portion 11g, and the edge surfaces of the base portion 11a are covered by the transparent resin body 17. Likewise, the bottom surface of the projected portion 12g of the lead frame 12 is exposed on the bottom surface of the transparent resin body 17, and the tip edge surfaces of the extending portions 12b to 12e are exposed on respective side surfaces of the transparent resin body 17. Meanwhile, the entire portion of the top surface 12h, a region of the bottom surface 12f other than the projected portion 12g, the side surfaces of the projected portion 12g, and the edge surfaces of the base portion 12a are covered by the transparent resin body 17. In the LED package 1, the bottom surfaces of the projected portions 11g and 12g exposed on the bottom surface of the transparent resin body 17 serve as external electrode pads, respectively. As described above, the shape of the transparent resin body 17 is rectangular as viewed from above, and the tip edge surfaces of the aforementioned multiple extending portions of each of the lead frames are exposed on mutually different three side surfaces. Note that, in this description, the term "cover" refers to a concept including both cases where a subject to cover is in contact with a subject to be covered and where a subject to cover is not in contact with a subject to be covered.

A large number of phosphors 18 are dispersed inside the transparent resin body 17. Each of the phosphors 18 is a particle shape and absorbs light emitted from the LED chip 14 and then emits light having a longer wavelength. For example, the phosphor 18 absorbs a part of blue light emitted from the LED chip 14 and then emits yellow light. Thus, the blue light emitted from the LED chip 14 but not absorbed by the phosphors 18, and the yellow light emitted from the phosphors 18 are emitted from the LED package 1, and the emitted light thus forms white light as a whole. Here, for the sake of convenience of illustration, the phosphors 18 are not shown in the drawings except FIGS. 2A, 19 and 21. In addition, in FIGS. 2A, 19 and 21, the phosphors 18 are shown larger and fewer than actual ones.

As the phosphors 18 described above, silicate phosphors emitting yellow-green, yellow, or orange light can be used, for example. A silicate phosphor can be expressed by the following general expression:

$(2-x-y)SrO.x(Ba_u, Ca_v)O.(1-a-b-c-d)SiO_2.aP_2O_5bAl_2O_3cB_2O_3dGeO_2: yEu^{2+}$, provided that, $0<x$, $0.005<y<0.5$, $x+y\leq1.6$, $0\leq a, b, c, d<0.5$, $0<u$, $0<v$, and $u+v=1$.

In addition, as the yellow phosphors, YAG phosphors can be used as well. A YAG phosphor can be expressed by the following general expression:

$(RE_{1-x}Sm_x)_3(Al_yGa_{1-y})_5O_{12}: Ce$, provided that, $0\leq x<1$, $0\leq y\leq1$, and RE is at least one element selected from the group consisting of Y and Gd.

Alternatively, as the phosphors 18, a mixture of sialon red and green phosphors can be used. Specifically, the phosphor can be a green phosphor that absorbs blue light emitted from the LED chip 14 and then emits green light, and a red phosphor that absorbs blue light and then emits red light.

The sialon red phosphor can be expressed by the following general expression, for example:

$(M_{1-x}, R_x)_{a1}AlSi_{b1}O_{c1}N_{d1}$, provided that, M is at least one metallic element excluding Si and Al. In particular, M is preferably at least one of Ca and Sr. R is a light emission center element, and Eu is particularly preferable. In addition, x, a1, b1, c1 and d1 are described as follows: $0<x\leq1$, $0.6<a1<0.95$, $2<b1<3.9$, $0.25<c1<0.45$, and $4<d1<5.7$.

A specific example of such a sialon red phosphor is shown below.

$Sr_2Si_7Al_7ON_{13}: Eu^{2+}$

The sialon green phosphor can be expressed by the following general expression, for example:

$(M_{1-x}, R_x)_{a2}AlSi_{b2}O_{c2}N_{d2}$, provided that, M is at least one metallic element excluding Si and Al. In particular, M is preferably at least one of Ca and Sr. R is a light emission center element, and Eu is particularly preferable. In addition, x, a2, b2, c2 and d2 are described as follows: $0<x\leq1$, $0.93<a2<1.3$, $4.0<b2<5.8$, $0.6<c2<1$, and $6<d2<11$.

A specific example of such a sialon green phosphor is shown below.

$Sr_3Si_{13}Al_3O_2N_{21}: Eu^{2+}$

Next, a manufacturing method of the LED package according to this embodiment will be described.

Figure 3:
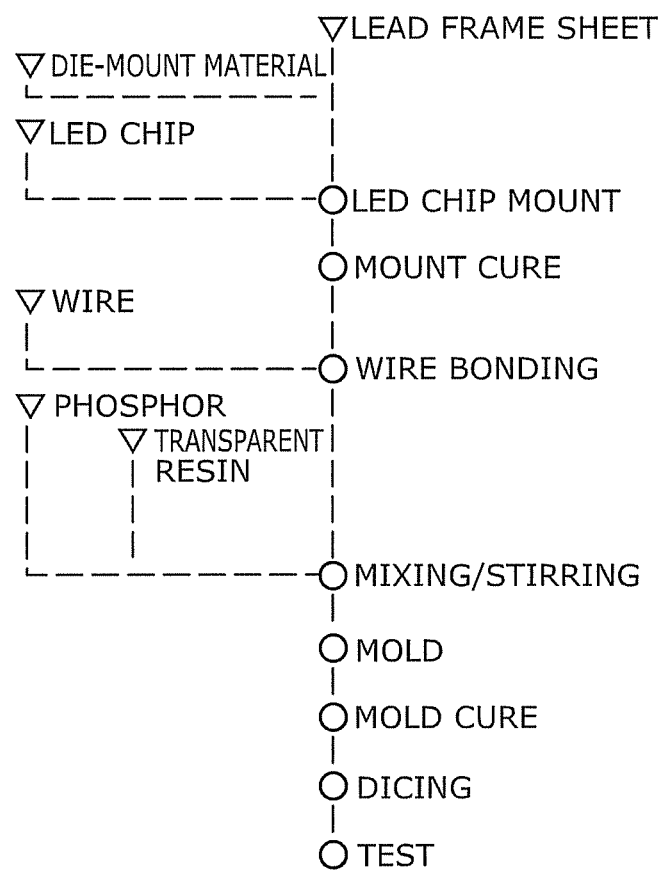
FIG. 3 is a flowchart illustrating a manufacturing method of the LED package according to the first embodiment.

FIG. 3 is a flowchart illustrating the manufacturing method of the LED package according to this embodiment.

FIGS. 4A to 4D, FIGS. 5A to 5C, and FIGS. 6A and 6B are process cross-sectional views illustrating the manufacturing method of the LED package according to this embodiment.

Figure 7A:
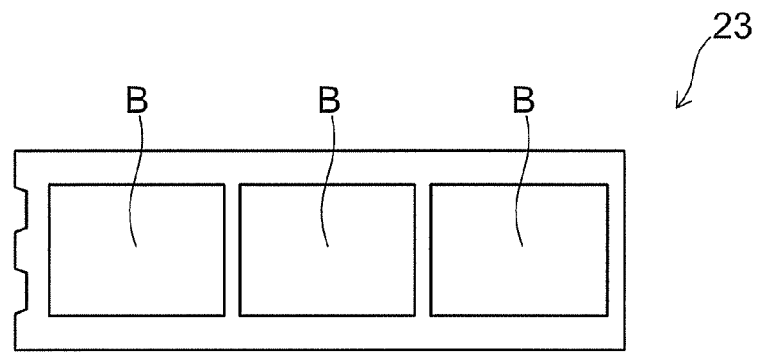
FIG. 7A is a plane view illustrating a lead frame sheet in the first embodiment.
Figure 7B:
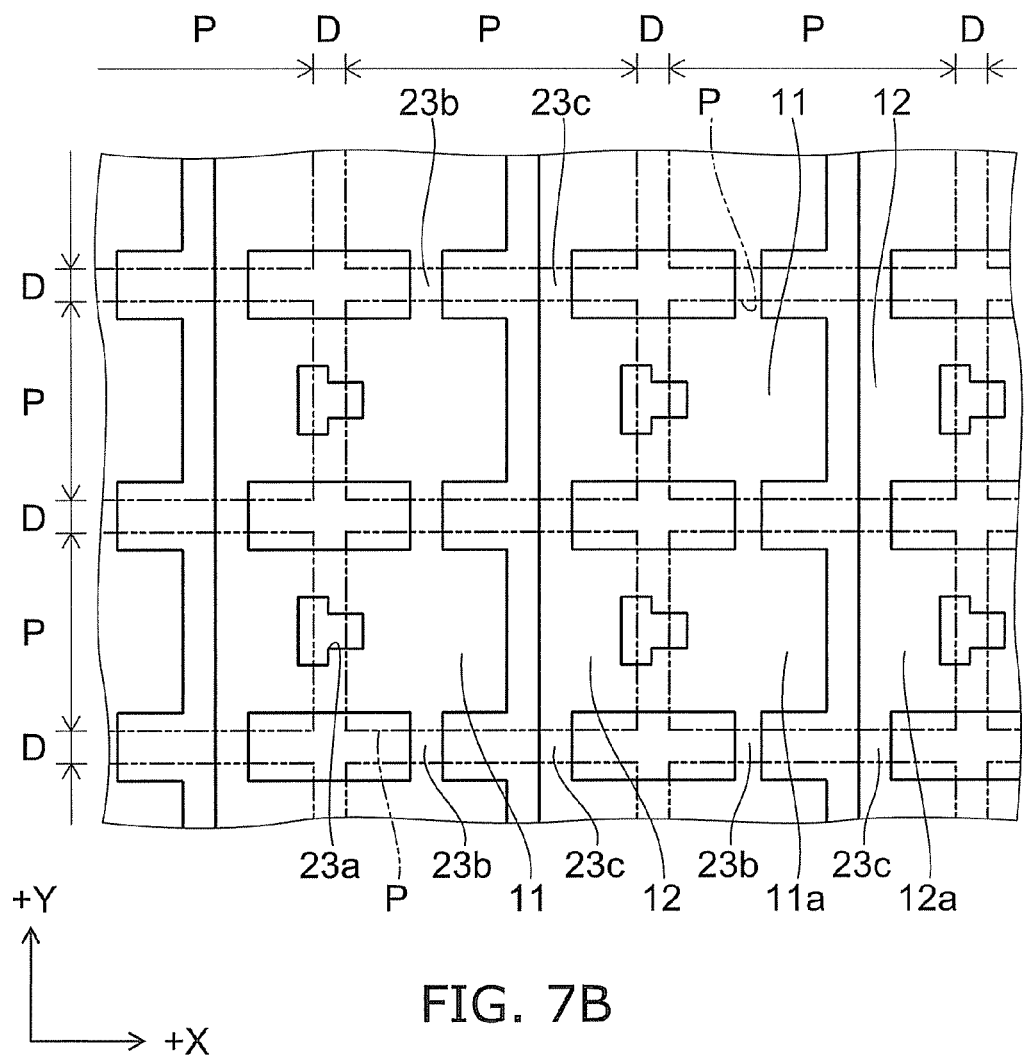
FIG. 7B is a partially enlarged plane view illustrating element regions of this lead frame sheet.

FIG. 7A is a plane view illustrating a lead frame sheet in this embodiment, and FIG. 7B is a partially enlarged plane view illustrating element regions of this lead frame sheet.

FIGS. 8A to 8F are process cross-sectional views illustrating a wire bonding method in this embodiment.

Figure 4A:
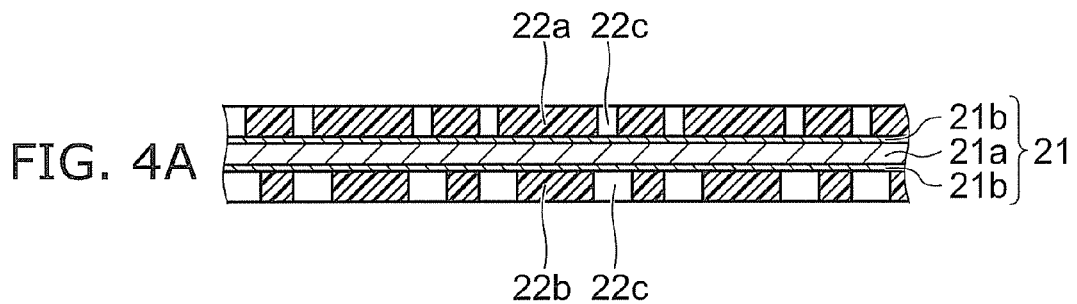
FIGS. 4A to 4D are process cross-sectional views illustrating the manufacturing method of the LED package according to the first embodiment.
Figure 4B:
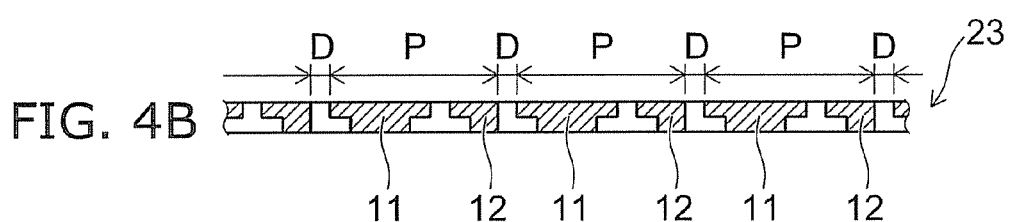

To being with, as shown in FIG. 4A, a conductive sheet 21 made of a conductive material is prepared. The conductive sheet 21 is obtained by forming silver-plated layers 21b on the top and bottom surfaces of a strip shaped copper plate 21a, respectively. Next, masks 22a and 22b are formed on the top and bottom surfaces of the conductive sheet 21, respectively. Opening portions 22c are selectively formed in each of the masks 22a and 22b. A printing method can be used to form the masks 22a and 22b, for example.

Next, the conductive sheet 21 is subjected to wet etching by immersing, in an etchant, the conductive sheet 21 on which the masks 22a and 22b are formed. Thereby, the portions of the conductive sheet 21 corresponding to the opening portions 22c are selectively etched away. At this time, the etching amount is controlled, for example, through adjustment of the immersion time in such a way that etching is stopped before etching from either one of the top and bottom surfaces of the conductive sheet 21 alone penetrates through the conductive sheet 21. Thereby, half etching is performed from the top and bottom surfaces. However, a portion etched from both of the top and bottom surfaces is caused to penetrate through the conductive sheet 21. Thereafter, the mask 22a and 22b are removed.

In the manner described above, as shown in FIG. 3 and FIG. 4B, the copper plate 21a and the silver-plated layers 21b are selectively removed from the conductive sheet 21, and a lead frame sheet 23 is thus formed. Note that, for the sake of convenience of illustration, in FIG. 4B and the drawings subsequent to FIG. 4B, the copper plate 21a and the silver-plated layers 21b are shown as the lead frame sheet 23 in an integrated manner and no distinction is made therebetween. As shown in FIG. 7A, three blocks B are set in the lead frame sheet 23, for example, and approximately 1000 element regions P are set in each of the blocks B, for example. As shown in FIG. 7B, the element regions P are arranged in a matrix, and a grid shaped dicing region D is formed between the element regions P. In each of the element regions P, a basic pattern including the lead frames 11 and 12 separated from each other is formed. In the dicing region D, the conductive member used to form the conductive sheet 21 remains so as to connect between adjacent element regions P.

Specifically, although the lead frames 11 and 12 are separated from each other in the element region P, a lead frame 11 that belongs to a certain one of the element regions P is connected to a lead frame 12 that belongs to the adjacent element region P positioned in −X direction as viewed from the certain one of the element regions P. Between both of the connected frames, an inverted T-shaped opening portion 23a facing in +X direction is formed. In addition, lead frames 11 that respectively belong to element regions P adjacent to each other in Y direction are connected to each other via a bridge 23b. Likewise, lead frames 12 that respectively belong to element regions P adjacent to each other in Y direction are connected to each other via a bridge 23c. In this manner, four conductive members extend in the three directions from each of the base portions 11a and 12a of the respective lead frames 11 and 12. Further, the etching from the bottom surface side of the lead frame sheet 23 is performed as half etching, thereby, forming the projected portions 11g and 12g (refer to FIG. 2A) on the bottom surfaces of the lead frames 11 and 12, respectively.

Figure 4C:
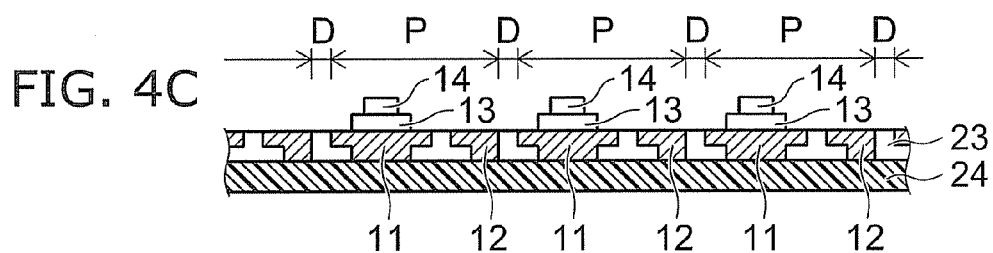

Next, as shown in FIG. 3 and FIG. 4C, a reinforcing tape 24 made of polyimide, for example, is attached to the bottom surface of the lead frame sheet 23. Then, the die-mount material 13 is adhered onto the lead frames 11, which belong to the respective element regions P of the lead frame sheet 23. For example, the die-mount material 13 in a paste state is discharged onto the lead frames 11 from a discharging device, or is transferred onto the lead frames 11 by a mechanical technique. Next, each of the LED chips 14 is mounted onto the die-mount material 13. Subsequently, a heating process (mount cure) for sintering the die-mount material 13 is performed. In this manner, the LED chip 14 is mounted on the lead frame 11 via the die-mount material 13 in each of the element regions P of the lead frame sheet 23.

Figure 4D:
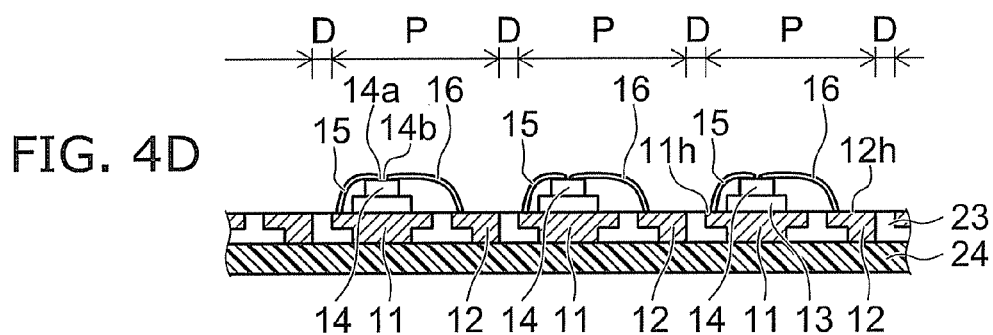

Next, as shown in FIG. 3 and FIG. 4D, one end of the wire 15 is bonded to the terminal 14a of each of the LED chips 14, and the other end thereof is bonded to the top surface 11h of the lead frame 11 by ultrasonic bonding. In addition, one end of the wire 16 is bonded to the terminal 14b of each of the LED chips 14, and the other end thereof is bonded to the top surface 12h of the lead frame 12. Thereby, the terminal 14a is connected to the lead frame 11 through the wire 15, and the terminal 14b is connected to the lead frame 12 through the wire 16.

Hereinafter, a method of bonding the wire 15 to the terminal 14a and the lead frame 11 will be described in detail. Note that, the same method is used for bonding the wire 16.

FIGS. 8A to 8F are diagrams illustrating a wire bonding method according to this embodiment.

As shown in FIG. 8A, a ball 132 formed of a bonding material is formed at a tip of a capillary 131. Next, as shown in FIG. 8B, the capillary 131 is moved so as to press the ball 132 against the top surface of the LED chip 14. Thereby, a bump 133 is formed on the top surface of the LED chip 14. Next, as shown in FIG. 8C, the capillary 131 is separated from the LED chip 14 without releasing the wire therefrom. Then, a new ball 134 is formed at the tip of the capillary 131. Next, as shown in FIG. 8D, the ball 134 is pressed against the top surface of the lead frame 11. Thereby, a bump 135 is formed on the top surface of the lead frame 11.

Next, as shown in FIG. 8E, the capillary 131 is moved in a substantially upper direction once while the wire 15 is released from the tip of the capillary 131. Then, the capillary 131 is moved in a substantially horizontal direction in such a way that the tip of the capillary 131 reaches the bump 133 on the LED chip 14. While the capillary 131 is moved, the end 15b of the wire 15 remains bonded to the lead frame 11 via the bump 135. In this manner, the wire 15 extracted from the bump 135 is curved in a horizontal direction. Next, second bonding is performed by application of load and ultrasonic wave to the bump 133 by the capillary 131. Thereby, the end 15a of the wire 15 is bonded to the LED chip 14 via the bump 133. In this manner, the wire 15 is connected between the lead frame 11 and the LED chip 14. When wire bonding is performed by this method, a bump as shown in FIG. 8F is formed at both of the bonding portion between the lead frame 11 and the wire 15, and the bonding portion between the LED chip 14 and the wire 15, i.e., both ends of the wire 15.

Figure 5A:
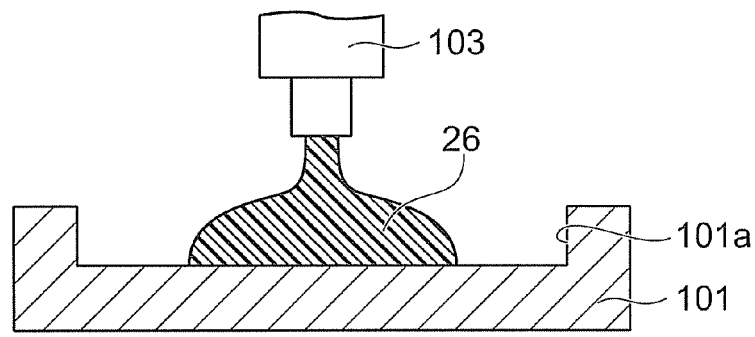
FIGS. 5A to 5C are process cross-sectional views illustrating the manufacturing method of the LED package according to the first embodiment.

Next, as shown in FIG. 3 and FIG. 5A, a lower mold 101 is prepared. The lower mold 101 forms a pair of molds with a later described upper mold 102. A rectangular solid recessed portion 101a is formed on the top surface of the lower mold 101. Meanwhile, a liquid or semi-liquid phosphor-containing resin member 26 is prepared by mixing the phosphors 18 (refer to FIG. 2A) into transparent resin such as silicone resin, and then stirring the phosphors and the transparent resin. Then, the phosphor-containing resin member 26 is supplied in the recessed portion 101a of the lower mold 101 by a dispenser 103.

Figure 5B:
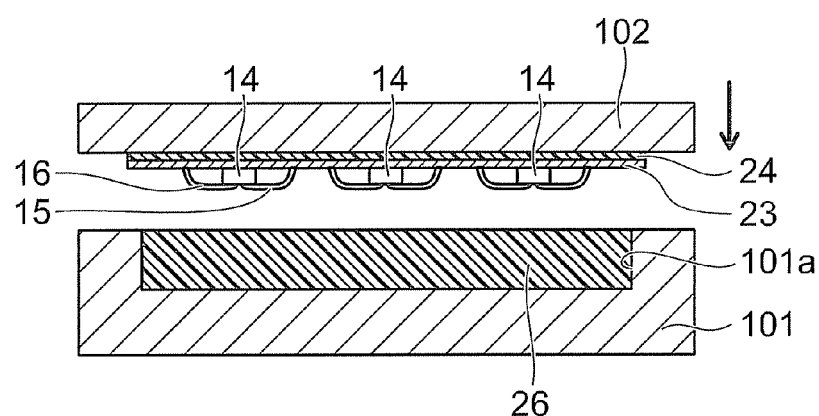

Next, as shown in FIG. 3 and FIG. 5B, the lead frame sheet 23 on which the aforementioned LED chips 14 are mounted is loaded on the bottom surface of the upper mold 102 in such a way that the LED chips 14 face downward. Then, the upper mold 102 is pressed against the lower mold 101 and the molds are clamped. Thereby, the lead frame sheet 23 is pressed against the phosphor-containing resin member 26. During this process, the phosphor-containing resin member 26 covers the LED chips 14, and the wires 15 and 16, and enters the portions removed by etching in the lead frame sheet 23. In this manner, the phosphor-containing resin member 26 is molded. This molding process is preferably performed in a vacuum atmosphere. Thereby, bubbles generated in the phosphor-containing resin member 26 are prevented from attaching to the half etched portions of the lead frame sheet 23.

Figure 5C:
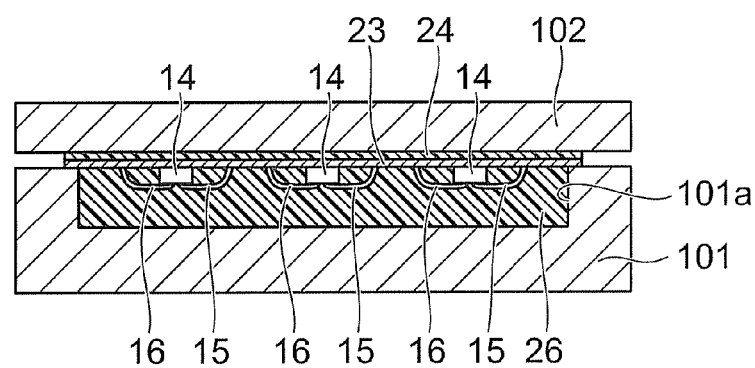

Next, as shown in FIG. 3 and FIG. 5C, a heating process (mold cure) is performed in a state where the top surface of the lead frame sheet 23 is pressed against the phosphor-containing resin member 26, whereby the phosphor-containing resin member 26 is cured. Thereafter, as shown in FIG. 6A, the upper mold 102 is separated from the lower mold 101. In the manner described above, a transparent resin plate 29, which covers the entire top surface and a part of the bottom surface of the lead frame sheet 23, and in which the LED chips 14 and the like are buried is formed. In the transparent resin plate 29, the phosphors 18 are dispersed (refer to FIG. 2A). Thereafter, the reinforcing tape 24 is peeled off from the lead frame sheet 23. Thereby, the bottom surfaces of the projected portions 11g and 12g (refer to FIG. 2A) of the respective lead frames 11 and 12 are exposed on the surface of transparent resin plate 29.

Next, as shown in FIG. 3 and FIG. 6B, dicing is performed on a resultant unit by a blade 104 from the lead frame sheet 23, i.e., from −Z direction to +Z direction, the resultant unit being formed of the lead frame sheet 23 and the transparent resin plate 29. Thereby, the portion arranged in the dicing region D in the lead frame sheet 23 and the transparent resin plate 29 is removed. As a result, the portions arranged in the respective element regions P in the lead frame sheet 23 and the transparent resin plate 29 are separated into individual pieces. Thus, the LED package 1 shown in FIG. 1 and FIGS. 2A and 2B is fabricated. Note that, dicing may be performed from the transparent resin plate 29 on the resultant unit formed of the lead frame sheet 23 and the transparent resin plate 29.

In each of the LED packages 1 obtained after dicing, the lead frames 11 and 12 are separated from the lead frame sheet 23. In addition, the transparent resin sheet 29 is cut into pieces, thereby forming the transparent resin bodies 17. The portions in the dicing region D extending in Y direction pass through the opening portions 23a of the lead frame sheet 23, thereby forming the extending portions 11d and 11e on each of the lead frames 11, and the extending portions 12d and 12e on each of the lead frames 12. In addition, since the bridges 23b are cut, the extending portions 1ib and 11c are formed on each of the lead frames 11. Moreover, since the bridges 23c are cut, the extending portions 12b and 12c are formed on each of the lead frames 12. The tip edge surfaces of the extending portions 11b to 11e and i2b to 12e are exposed on the side surfaces of each of the transparent resin bodies 17.

Next, as shown in FIG. 3, various tests are conducted on the LED packages 1. The tip edge surfaces of the extending portions 11b to 11e and 12b to 12e can also be used as test terminals.

Next, advantageous effects of this embodiment will be described.

Figure 9A:
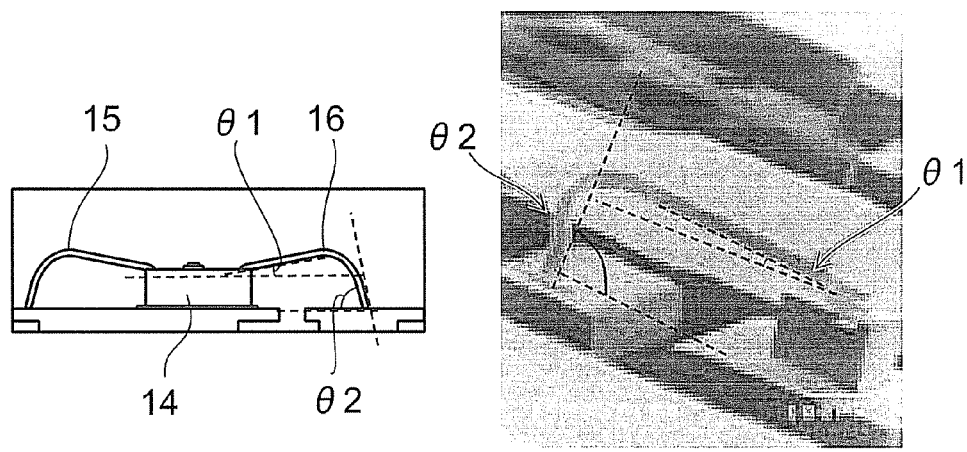
FIGS. 9A and 9B are schematic diagrams and photo images for illustrating effects of the first embodiment.
Figure 9B:
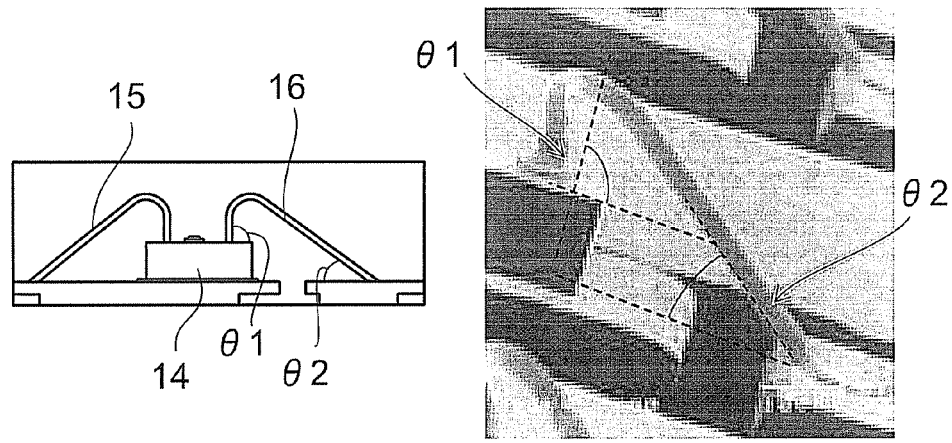

FIGS. 9A and 9B are schematic diagrams and photo images for illustrating effects of this embodiment. FIG. 9A shows the LED package according to this embodiment, and FIG. 9B shows an LED package according to a comparison example.

As shown in FIG. 9A, in this embodiment, the chip side angle θ1 of each of the wires 15 and 16 is smaller than a corresponding one of the frame side angles θ2. Specifically, the angle (chip side angle θ1) at which the wire is extracted from the top surface of the LED chip 14 is set smaller than the angle (frame side angle θ2) at which the wire is extracted from the top surface of the lead frame. Here, the top surface of the LED chip 14 is located at a relatively high position while the top surface of the lead frame is located at a relatively low position. In this manner, a low wire loop can be formed. Thus, even when the transparent resin body 17 repeats thermal expansion and thermal contraction, it is possible to suppress the amount of displacement of each of the wires. In addition, it is possible to form the transparent resin body 17 itself with a small thickness, so that the thermal stress generated in the transparent resin body 17 can be reduced. When the thickness of the transparent resin body 17 is smaller than five times of the thickness of the LED chip 14, the effect to reduce the thermal stress can be surely obtained. When the thickness of the transparent resin body 17 is smaller than three times of the thickness of the LED chip 14, the effect becomes prominent. According to this embodiment, because of the aforementioned effects, it is possible to prevent fracture of the wires and the wire bonding portions, which is caused by the thermal stress.

On the other hand, as shown in FIG. 9B, the chip side angle θ1 of each of the wires 15 and 16 is larger than a corresponding one of the frame side angles θ2 in the comparison example of this embodiment. For this reason, the wires are to be extracted in a substantially right-above direction (+Z direction) from the top surface of the LED chip 14, which is located at a relatively high position. Accordingly, the position where the wire loops are arranged is high. As a result, the transparent resin body 17 cannot be formed with a small thickness in this case, so that the thermal stress generated in the transparent resin body 17 becomes large. In addition, since the wires are arranged at a high position, the amount of displacement of each of the wires is large when the transparent resin body 17 thermally expands and contracts. As a result, the wires and the wire bonding portions are easily fractured.

Hereinafter, other advantageous effects of this embodiment will be described.

In the LED package 1 according to this embodiment, since the envelope formed of white resin is not provided, degradation of the envelope due to absorption of light and heat generated from the LED chips 14 does not occur. In particular, in a case where the envelope is formed of polyamide thermoplastic resin, degradation of the envelope proceeds easily, but such a concern does not exist in this embodiment. For this reason, the LED package 1 according to this embodiment has a high durability. Thus, the LED package 1 according to this embodiment has a long life and high reliability and is applicable to wide range of applications.

Further, in the LED package 1 according to this embodiment, the transparent resin body 17 is formed of silicone resin. Since silicone resin is highly resistant to light and heat, the durability of the LED package 1 is thereby improved.

Moreover, in the LED package 1 according to this embodiment, no envelope to cover the sidewalls of the transparent resin body 17 is provided, so that light is emitted over a wide angle. Thus, the LED package 1 according to this embodiment is advantageous for use in an application in which light needs to be emitted over a wide angle, e.g., for use as an illumination and as a backlight in a liquid crystal television.

Furthermore, in the LED package 1 according to this embodiment, the transparent resin body 17 covers a part of the bottom surfaces of and the most part of the edge surfaces of the lead frames 11 and 12, thereby holding the periphery portions of the lead frames 11 and 12. Thus, the lead frames 11 and 12 can be held in a more rigid manner while the bottom surfaces of the projected portions 11g and 12g of the respective lead frames 11 and 12 are exposed from the transparent resin body 17 to achieve the external electrode pads. Specifically, the notches are formed respectively at the bottom surfaces of both end portions of each of the base portions 11a and 12a in X direction by forming the projected portions 11g and 12g at the center portions of the lead frames 11 and 12 in X direction, respectively. The transparent resin body 17 flows around and into these notches, thereby making it possible to solidly hold the lead frames 11 and 12. Accordingly, the lead frames 11 and 12 become unlikely to be peeled off from the transparent resin body 17 during the dicing process, which, in turn, can improve the fabrication yield of the LED packages 1. In addition, it is possible to prevent peeling of the lead frames 11 and 12 from the transparent resin body 17 due to a temperature stress during the time when the fabricated LED package 1 is used.

Furthermore, in the LED package 1 according to this embodiment, the silver-plated layers are formed respectively on the top and bottom surfaces of each of the lead frames 11 and 12. Since a silver-plated layer has a high light reflectivity, the light-extraction efficiency of the LED package 1 according to this embodiment is high.

Moreover, in this embodiment, a large number of the LED packages 1, e.g., several thousand LED packages 1 can be collectively fabricated from a single conductive sheet 21. Thereby, the manufacturing cost per LED package 1 can be reduced. In addition, since no envelope is provided in the LED package 1 according to this embodiment, the number of components listed in the bill of materials, and the number of processes are less, and thus, the manufacturing cost is low.

Further, in this embodiment, wet etching is used to form the lead frame sheet 23. Thus, when an LED package of a new layout is to be manufactured, only the original plate mask needs is to be prepared. Accordingly, as compared with a case where a method such as mold pressing is used to form the lead frame sheet 23, it is possible to suppress the initial cost.

Further, in the LED package 1 according to this embodiment, the extending portions extend from each of the base portions 11a and 12a of the respective lead frames 11 and 12. Thereby, the base portions themselves are prevented from being exposed on the side surfaces of the transparent resin body 17, and thus, the exposed areas of the lead frames 11 and 12 can be reduced. Meanwhile, the contact areas between the lead frames 11 and 12, and the transparent resin body 17 can be increased. As a result, peeling of the lead frames 11 and 12 from the transparent resin body 17 can be prevented. Further, corrosion of the lead frames 11 and 12 can be suppressed.

When the effects are viewed in terms of the manufacturing method, as shown in FIG. 7B, the amount of metal portion in the dicing region D is reduced by providing the opening portions 23a, the bridges 23b and 23c in such a way that the opening portions 23a, the bridges 23b and 23c are interposed in the dicing region D in the lead frame sheet 23. Such a reduction in the metal portion makes the dicing easier, and thus can suppress abrasion of the dicing blade. In addition, the four extending portions extend in three directions from each of the lead frames 11 and 12 in this embodiment. Thereby, during the process of mounting the LED chips 14 shown in FIG. 4C, each of the lead frames 11 is surely supported from the three directions by the lead frames 11 and the lead frame 12 of adjacent element regions P, so that the mountability is increased. Likewise, during the wire bonding process shown in FIG. 4D, the wire bonding positions are surely supported from the three directions, so that ultrasonic wave applied thereto during ultrasonic bonding, for example, is less likely to go away. Thus, the wires can be bonded to the lead frames and the LED chip in a good state.

Moreover, in this embodiment, during the dicing process shown in FIG. 6B, dicing is performed from the lead frame sheet 23. Thereby, the metal member forming the cut edges of the lead frames 11 and 12 stretches on the side surfaces of the transparent resin body 17 in +Z direction. Thus, no burr occurs in this case, the burr being caused when the metal member stretches on the side surfaces of the transparent resin body 17 in −Z direction and protrudes from the bottom surface of the LED package 1. Accordingly, no implementation failure caused by burr occurs during implementation of the LED package 1.

Next, a first modification example of this embodiment will be described.

This modification example is a modification example of the wire bonding method.

Specifically, the wire boding method shown in FIG. 4D of the aforementioned first embodiment is different in this modification example.

Figure 10A:
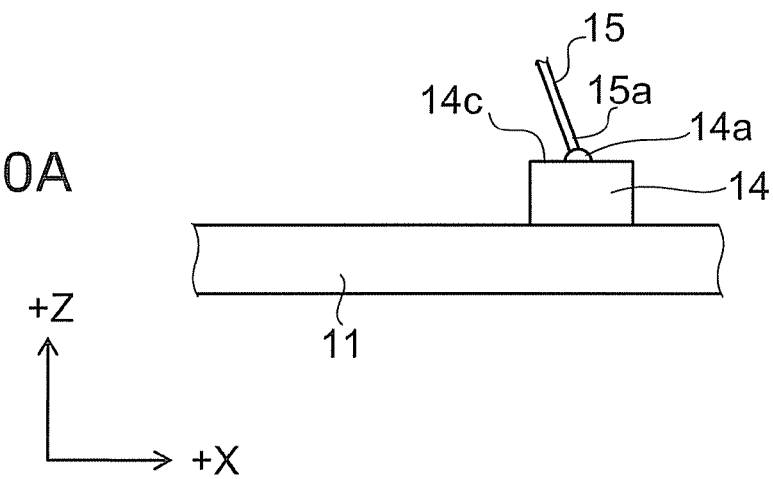
FIGS. 10A to 10C are process cross-sectional views illustrating a wire bonding method in a first modification example of the first embodiment.
Figure 10B:
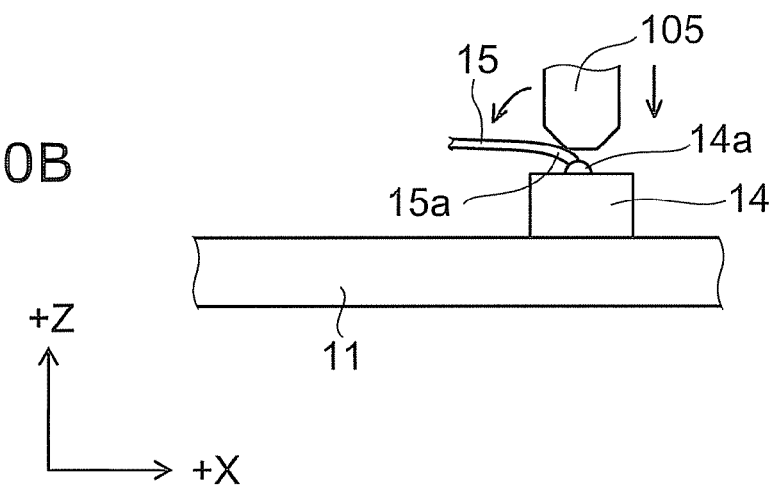
Figure 10C:
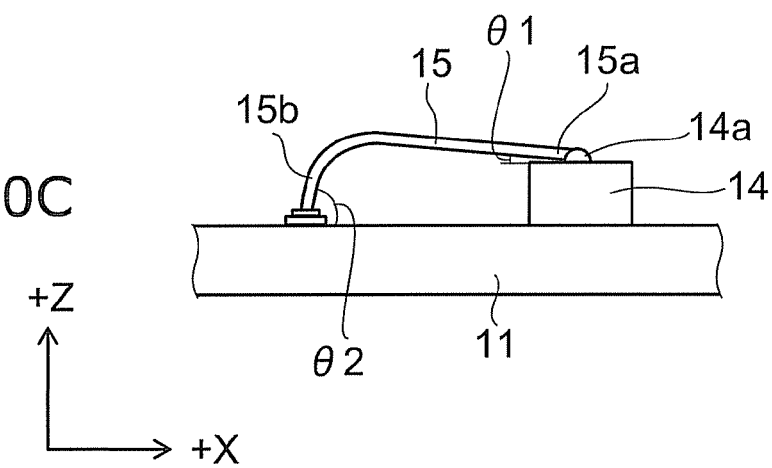

FIGS. 10A to 10C are process cross-sectional views illustrating the wire bonding method in this modification example.

To being with, as shown in FIG. 10A, the end 15a on one end of the wire 15 is bonded to the terminal 14a provided on the top surface 14c of the LED chip 14, and then, the wire 15 is extracted in an upper oblique direction. Next, as shown in FIG. 10B, the bonding portion between the end 15a and the terminal 14a is pressed from above by a jig 105. Thereby, the direction in which the wire 15 is extracted from the terminal 14a is inclined and thus made closer to −X direction. Next, as shown in FIG. 10C, the end 15b on the other end of the wire 15 extracted from the bonding portion is bonded to the lead frame 11. Next, the wire 15 is cut. Thereby, the wire 15 is connected between the terminal 14a and the lead frame 11. At this time, the chip side angle θ1 of the wire 15 is smaller than the frame side angle θ2. In addition, in this case, no bump is formed at the bonding portions of the wire and the lead frame. The configuration according to this modification example other than the part described above, and the manufacturing method and the advantageous effects of this modification example are the same as those of the aforementioned first embodiment.

Next, a second modification example of this embodiment will be described.

This modification example is a modification example of the wire loop shape.

Figure 11A:
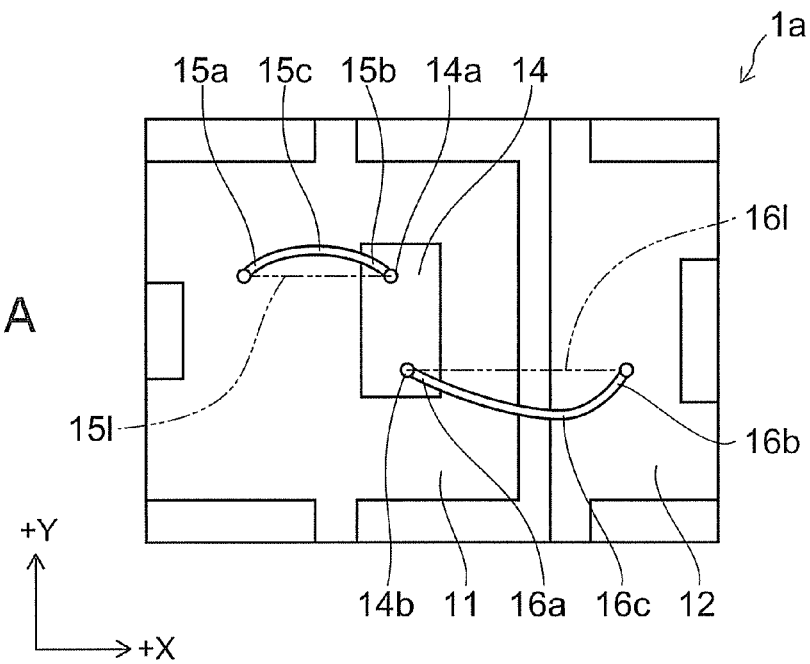
FIG. 11A is a plane view illustrating an LED package according to a second modification example of the first embodiment.
Figure 11B:
FIG. 11B is a photo image illustrating a wire bonding portion.

FIG. 11A is a plane view illustrating an LED package according to this modification example, and FIG. 11B is a photo image illustrating a wire bonding portion.

As shown in FIGS. 11A and 11B, in an LED package is according to this modification example, a middle portion 15c other than both of the ends 15a and 15b of the wire 15 is arranged at a position outside a region immediately above a straight line 151 connecting the end 15a of the wire 15 to the end 15b thereof. Likewise, a middle portion 16c other than both of the ends 16a and 16b of the wire 16 is arranged at a position outside a region immediately above a straight line 161 connecting the end 16a of the wire 16 to the end 16b thereof. That is, projection images to the lead frames 11 and 12 of the wires 15 and 16 wind. As described above, the wires 15 and 16 are loosely arranged in Y direction while being diverted in Y direction in this modification example.

In this modification example, since the wires 15 and 16 are loosely arranged in Y direction, the thermal stress applied to the wires 15 and 16 from the transparent resin body 17 can be eased. Thereby, fracture of the wires 15 and 16 can be more surely prevented.

Next, a third modification example of this embodiment will be described.

This modification example is an example of the wire loop shape in a case where multiple LED chips are mounted in a single LED package.

Figure 12:
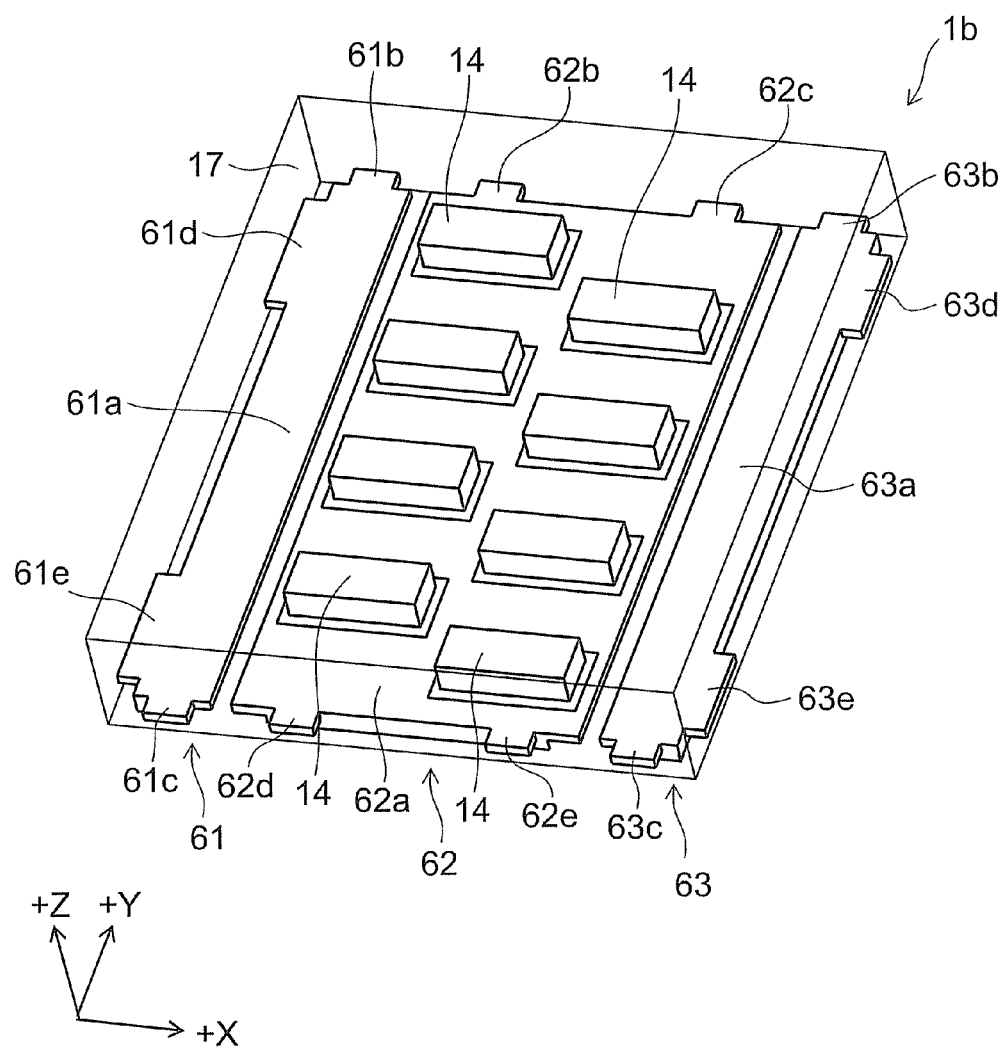
FIG. 12 is a perspective view illustrating an LED package according to a third modification example of the first embodiment.

FIG. 12 is a perspective view illustrating an LED package according to this modification example.

FIG. 13A is a plane view illustrating lead frames, LED chips and wires of the LED package according to this modification example, FIG. 13B is a bottom surface view illustrating the LED package, and FIG. 13C is a cross-sectional view illustrating the LED package.

Figure 14:
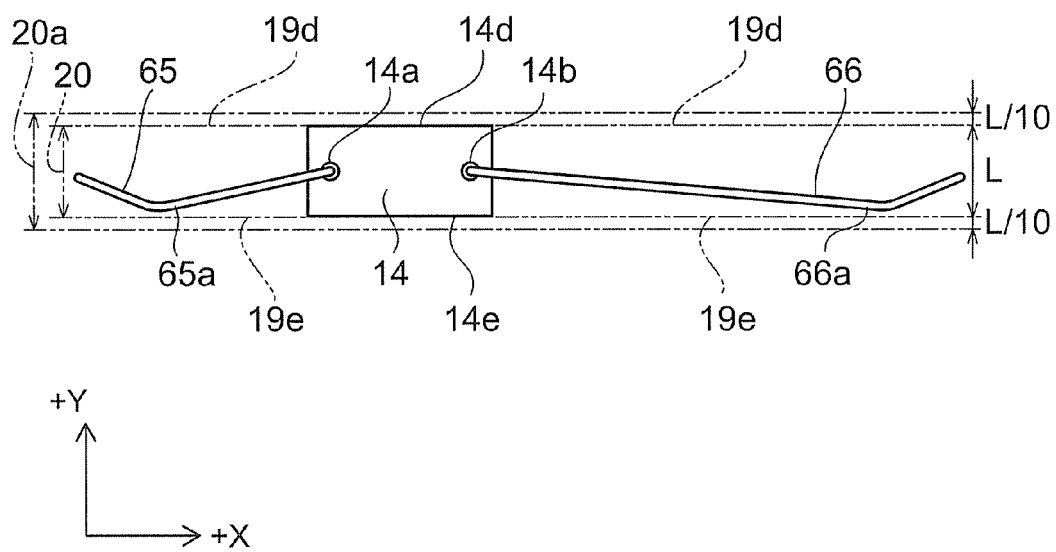
FIG. 14 is a plane view illustrating the LED chip and the wires of the LED package according to the third modification example of the first embodiment.

FIG. 14 is a plane view illustrating the LED chip and the wires of the LED package according to this modification example.

Note that, illustration of the wires is omitted in FIG. 12.

As shown in FIG. 12 and FIGS. 13A to 13C, in an LED package 1b according to this modification example, three lead frames 61, 62 and 63 are provided with a space between each other. In the lead frame 61, a extending portion 61b extends in +Y direction, a extending portion 61c extends in −Y direction, and two extending portions 61d and 61e extend in −X direction from a strip shaped base portion 61a having the longitudinal direction thereof in Y direction. In the lead frame 62, two extending portion 62b and 62c extend in +Y direction and two extending portions 62d and 62e extend in −Y direction from a strip shaped base portion 62a having the longitudinal direction thereof in Y direction. The shape of the lead frame 63 is roughly the same as a shape obtained by reversing the lead frame 61 in X direction, but extending portions 63d and 63e of the lead frame 63 are narrower than the extending portions 61d and 61e.

In addition, in the LED package 1b, multiple LED chips 14, e.g., eight LED chips 14 are provided. The LED chips 14 are provided in two columns each including four LED chips aligned along Y direction. The alignment phases of the LED chips 14 in the columns in +X and −X directions are shifted by an approximately half cycle, and thus, the LED chips 14 are alternately arranged in the columns. The LED chips 14 are mounted on the lead frame 62 via respective die-mount materials (not shown) and arranged in such a way that the direction from one terminal to the other terminal of each of the LED chips 14 is in X direction. The terminal 14a (refer to FIG. 14) of each of the LED chips 14 is connected to the lead frame 61 through a wire 65, and the terminal 14b (refer to FIG. 14) thereof is connected to the lead frame 63 through a wire 66. Further, the bottom surfaces of projected portions 61g, 62g and 63g of the respective lead frames 61, 62 and 63 are exposed on the bottom surface of the transparent resin body 17. Meanwhile, the bottom surfaces of thin plate portions 61t, 62t and 63t of the respective lead frames 61, 62 and 63 are covered by the transparent resin body 17. Note that, in FIG. 13A, the relatively thin portions of the lead frames 61, 62 and 63, i.e., the thin plate portions and extending portions are shown by broken-line hatching.

Then, the chip side angle of each of the wires 65 and 66 is smaller than a corresponding one of the frame side angles. For example, the chip side angle is substantially between 0° and 5°, and the frame side angle is substantially between 85° and 90°. In addition, a middle portion of each of the wires is arranged at a position outside a region immediately above a straight line connecting both ends of the wire. The middle portion of each of the wires is displaced in a direction toward a center portion of the LED package 1b in Y direction from the region immediately above the straight line connecting both ends of the wire. Specifically, in the LED package 1b, the middle portion of each of the wires 65 and 66 connected to a corresponding one of four LED chips 14 arranged on the +Y side of the lead frame 62 is displaced in −Y direction, as viewed from above (+Z direction), from the straight line connecting both ends of the wire. In addition, the middle portion of each of the wires 65 and 66 connected to a corresponding one of four LED chips 14 arranged on the −Y direction side of the lead frame 62 is displaced in +Y direction, as viewed from above (+Z direction), from the straight line connecting both ends of the wire. As described, each of the wires is curved toward the inner side of the LED package 1b. That is, the projection images of the wires 65 and 66 are convex toward a center portion of the LED package 1b. Hereinafter, such a wire shape is referred to as an "inner curvature." Meanwhile, a state where a wire is curved toward the outer side of the LED package is referred to as an "outer curvature." In addition, a state where the middle portion of a wire is positioned in the region immediately above the straight line connecting both ends tof the wire is referred to as a "straight line shape."

As shown in FIG. 14, there is an upper limit for a preferable range of the amount of displacement of a wire. Specifically, as viewed from above, middle portions 65a and 66a of the respective wires 65 and 66 are preferably substantially positioned within a region 20 between extension surfaces 19d and 19e of respective two side surfaces 14d and 14e extending in X direction of the LED chip 14 to which the wire is connected. However, there is a case where a part of wire extends outside the region 20 in a fabricated LED package even when bonding is performed to locate the wire within the region 20. This is because an error inevitably occurs in the wire bonding position, and also, a wire slightly deforms when subjected to molding with a resin material after bonding. Even in this case, as long as the most portion of the wire is positioned within the region 20, approximately the same effect as that of a case where the entire portion of the wire is positioned within the region 20 can be obtained, however. In this respect, a region 20a is set in this embodiment. The region 20a is obtained by expanding the region 20 outwardly from each of the extension surfaces 19d and 19e by an amount (L/10) where a distance between the extension surfaces 19d and 19e is set to L. Thus, even when a portion of each of the wires exists outside the region 20, as long as the portion is positioned within the region 20a, the wire is considered to be substantially positioned within the region 20. Note that, the amount (L/10) used as the shift amount, i.e., the length equal to 10% of the width of the LED chip, is approximately equal to the thickness of the wire.

According to this modification example, since each of the wires is formed in the inner curvature, fracture of the wire due to the thermal stress can be more surely prevented as compared with a case where the wire is formed in the straight line shape or the outer curvature.

Hereinafter, this effect will be described on the basis of specific test examples.

TEST EXAMPLE 1

FIGS. 15A to 15D are photo images illustrating samples evaluated in this test example.

Figure 16:
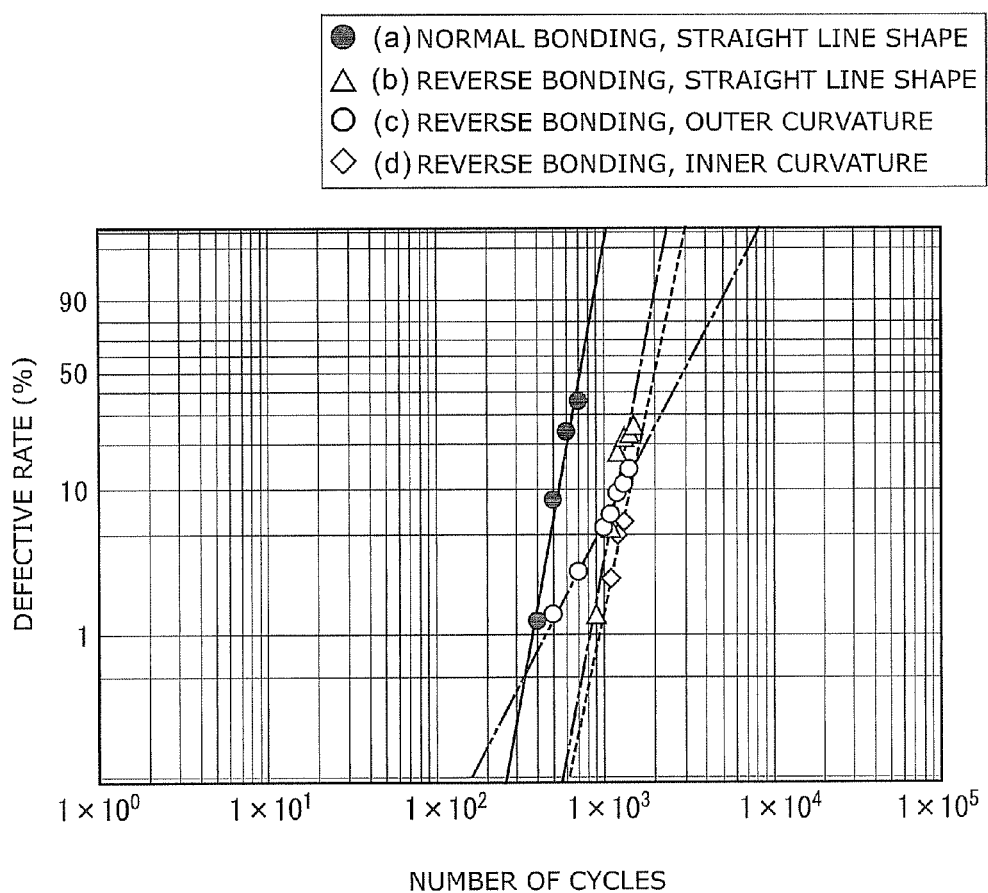
FIG. 16 is a graph drawn by taking the number of thermal cycles along the horizontal axis and the defective rates along the vertical axis to exemplify the durability of each wire loop.

FIG. 16 is a graph drawn by taking the number of thermal cycles along the horizontal axis and the defective rates along the vertical axis to exemplify the durability of each wire loop.

As shown in FIGS. 15A to 15D, in this test example, each test sample was fabricated by mounting eight LED chips on a lead frame and bonding wires between each of the LED chips and the lead frames.

In the sample shown in FIG. 15A, the chip side angle θ1 (refer to FIG. 2A) was set larger than the frame side angle θ2 (refer to FIG. 2A). Hereinafter, such a state of wire is referred to as "normal bonding." Specifically, the chip side angle θ1 was set to 80°, and the frame side angle θ2 was set to 20°. In addition, the wire was formed in the "straight line shape." Specifically, the sample shown in FIG. 15A is a "normal bonding" and "straight line shape" sample.

In the sample shown in FIG. 15B, the chip side angle θ1 was set smaller than the frame side angle θ2 as described in the first embodiment. Hereinafter, such a state of wire is referred to as "reverse bonding." Specifically, the chip side angle θ1 was set to 0°, and the frame side angle θ2 was set to 90°. In addition, the wire was formed in the "straight line shape." Specifically, the sample shown in FIG. 15B is a "reverse bonding" and "straight line shape" sample.

In the sample shown in FIG. 15C, the chip side angle θ1 and the frame side angle θ2 were set in the same manner as the sample shown in FIG. 15B. In addition, the wire was formed in the "outer curvature." Specifically, the sample shown in FIG. 15C is a "reverse bonding" and "outer curvature" sample.

In the sample shown in FIG. 15D, the chip side angle θ1 and the frame side angle θ2 were set in the same manner as the sample shown in FIG. 15B. In addition, the wire was formed in the "inner curvature" as described in the third modification example of the first embodiment. Specifically, the sample shown in FIG. 15D is a "reverse bonding" and "inner curvature" sample. Moreover, in this sample, the middle portion of each of the wires was positioned, as viewed from above, in the region between the extension surfaces of the two side surfaces extending in X direction of a corresponding one of the LED chips to which the wire is connected.

A thermal cycle test from −40° C. as the lowest temperature to 110° C. as the highest temperature was conducted on these samples. Then, whether or not the LED chip lights up was checked in several numbers of cycles, and a ratio of the LED chips that did not light up was defined as the defective rate. The test result is shown in FIG. 16. In addition, the number of thermal cycles at which the defective rate becomes 1% was estimated on the basis of the test result shown in FIG. 16. This number of thermal cycles is referred to as a "life." The estimation results are shown in Table 1. An "improvement rate" shown in Table 1 is a value obtained by standardizing the life using the test result of the comparison example as a standard.

TABLE 1

| Sample | | | Life (Number of Cycles) | Improvement Rate |
|---|---|---|---|---|
| (a) | Normal Bonding | Straight Line Shape | 373 | 1.0 |
| (b) | Reverse Bonding | Straight Line Shape | 823 | 2.2 |
| (c) | Reverse Bonding | Outer Curvature | 446 | 1.2 |
| (d) | Reverse Bonding | Inner Curvature | 924 | 2.5 |

As shown in FIG. 16 and Table 1, as compared with the "normal bonding" sample shown in FIG. 15A, the life of the "reverse bonding" sample shown in FIG. 15B was improved to approximately 2.2 times. Moreover, in comparison between the reverse bonding samples, the life of the "inner curvature" sample shown in FIG. 15D was further improved as compared with the "straight line shape" sample shown in FIG. 15B. Meanwhile, the life of the "outer curvature" sample shown in FIG. 15C was shorter than the life of the "reverse bonding" and "straight line shape" sample shown in FIG. 15B although the life thereof was longer than the life of the "normal bonding" and "straight line shape" sample shown in FIG. 15A.

A reason why the "inner curvature" has a long life as compared with the "outer curvature" can be considered as follows. Specifically, when a transparent resin body is heated and thus expands, a force toward an outer upward direction of the LED package is applied to the wires. When the transparent resin body is cooled and thus contracts, a force toward an inner downward direction of the LED package is applied to the wires. Thereby, the center portion of each of the wires is substantially reciprocated between the outer upward direction of the LED package, and the inner downward direction thereof. If the shape of the wire is the "inner curvature," the aforementioned reciprocating movement acts to rotate the wire loop around the straight line connecting to both ends of the wire because the center portion of the wire is located at the inner upward position with respect to both ends of the wire. Thus, the tolerance against the reciprocating motion is high in this case. On the other hand, if the shape of the wire is the "outer curvature," the aforementioned reciprocating motion acts to destroy or pull out the wire loop because the center portion of the wire is located at the outer upward position with respect to both ends of the wire. Thus, the tolerance against the reciprocating motion is low in this case. For the reasons described above, it is considered that the life of the "inner curvature" was longer than the "outer curvature" and the life of the "straight line shape" was between those of "inner curvature" and the "outer curvature" with respect to thermal cycles.

TEST EXAMPLE 2

This test example is a test example conducted for evaluating the influence the size of curvature has on the life of an LED package.

Ten "reverse bonding" and "inner curvature" samples as described in the third modification example of the aforementioned first embodiment (refer to FIG. 12 to FIG. 14) were fabricated. In each of the samples, the middle portion of each of the wires was positioned, as viewed from above, within the region between the extension surfaces of the two side surfaces extending in X direction of a corresponding one of the LED chips to which the wire is connected, as in the case of the third modification example. Note that, as described above, an error within 10% was allowed. Such a degree of curvature is described as "normal." The thickness of the transparent resin body in each of these samples was set to 650 μm.

On the other hand, in addition to the aforementioned ten samples, ten "reverse bonding" and "inner curvature" samples in each of which a degree of curvature of each wire is larger than that of the aforementioned ten samples were fabricated. Unlike the third modification example, in each of these samples, the middle portion of each of the wires was extended, as viewed from above, to an outside of the region between the extension surfaces of the two side surfaces extending in X direction of a corresponding one of the LED chips to which the wire is connected. Specifically, the middle portion of each of the wires was extended to an outside of the expanded region 20a shown in FIG. 14. Such a degree of curvature is described as "large." The thickness of the transparent resin body in each of the samples was set to 650 μm.

A thermal cycle test from −40° C. as the lowest temperature to 110° C. as the highest temperature was conducted on these 20 samples. Whether or not the LED chip lights up was checked every 100 cycles, and the number of LED chips that did not light up was recorded. The test results are shown in Table 2. Each single-digit figure shown in Table 2 indicates the number of samples that did not light up out of the ten samples.

TABLE 2

| Degree of Curvature | Number of Thermal Cycles | | | | | Judgment |
|---|---|---|---|---|---|---|
| | 100 | 200 | 300 | 400 | 500 | |
| Normal | 0 | 0 | 0 | 0 | 0 | Excellent |
| Large | 0 | 0 | 0 | 0 | 4 | Good |

At the end of 500 cycles, the number of "normal" curvature samples that did not light up was zero out of ten. For this reason, these samples were judged to have an excellent durability and thus judged as "excellent." On the other hand, at the end of 400 cycles, the number of the "large" curvature samples that did not light up was zero out of ten, which indicates a level of durability considered to be no problem in practical use. However, at the end of 500 cycles, four out of the ten samples did not light up. Thus, the samples were judged as "good."

TEST EXAMPLE 3

In this test example, the same thermal cycle test was conducted on samples each including a transparent resin body 17 having a different thickness. Table 3 shows a defective rate (%) at each number of cycles. The thickness of each LED chip was set to 0.14 mm. The "ratio" shown in Table 3 indicates a ratio of the thickness of a transparent resin body with respect to the thickness of the LED chip. In this acceleration test, when a defective rate reaches 20% in 1000 cycles, in terms of reliability, a judgment was made that some kind of action needs to be taken for practical use, and the sample is thus judged as "Not Good." In addition, when a defective rate is less than 20% in 1000 cycles, a judgment was made that the sample has no problem in practical use, and the sample is judged as "Good." Further, when no defect occurs in 1000 cycles, a judgment was made that the sample has an excellent durability, and the sample is thus judged as "Excellent."

TABLE 3

| Thickness of Transparent Resin (mm) | Ratio | Before Test | 100 | 200 | 300 | 400 | 500 | 600 | 700 | 800 | 900 | 1000 | Judgment |
|---|---|---|---|---|---|---|---|---|---|---|---|---|---|
| 0.40 | 2.9 | 0 | 0 | 0 | 0 | 0 | 0 | 0 | 0 | 0 | 0 | 0 | Excellent |
| 0.55 | 3.9 | 0 | 0 | 0 | 0 | 0 | 10 | 10 | 10 | 10 | 10 | 10 | Good |
| 0.70 | 5.0 | 0 | 0 | 0 | 10 | 10 | 10 | 15 | 15 | 15 | 20 | 20 | Not Good |

As shown in Table 3, the defective rate of the sample including the transparent resin body having a thickness of 0.70 mm was 0% until 200 cycles, but the defective rate started increasing thereafter and became 20% in 1000 cycles. In addition, the defective rate of the sample including the transparent resin body having a thickness of 0.55 mm was 0% until 400 cycles, but the defective rate became 10% in 500 cycles, and thereafter, remained at 10% until 1000 cycles. Meanwhile, the defective rate of the sample including the transparent resin body having a thickness of 0.40 mm stayed at 0% until 1000 cycles. Accordingly, it can be seen that the durability of wire is high when the transparent resin body is formed to have a small thickness. In addition, a judgment was made that there is no problem in practical use if the ratio of the transparent resin body with respect to the thickness of the LED chip is less than 5. Further, the durability was particularly excellent if this ratio is less than 3.

Next, a fourth modification example of this embodiment will be described.

This modification example is a modification example of the lead frame sheet formation method.

Specifically, the lead frame sheet formation method shown in FIG. 4A of the aforementioned first embodiment is different in this modification example.

FIGS. 17A to 17H are process cross-sectional views illustrating a lead frame sheet formation method in this modification example.

Figure 17A:
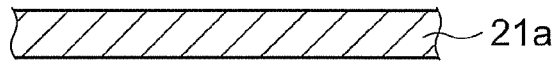
FIGS. 17A to 17H are process cross-sectional views illustrating a lead frame sheet formation method in the third modification example of the first embodiment.
Figure 17B:
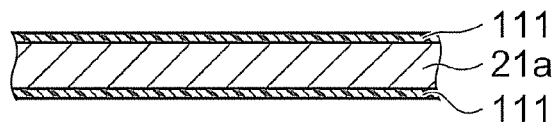
Figure 17C:
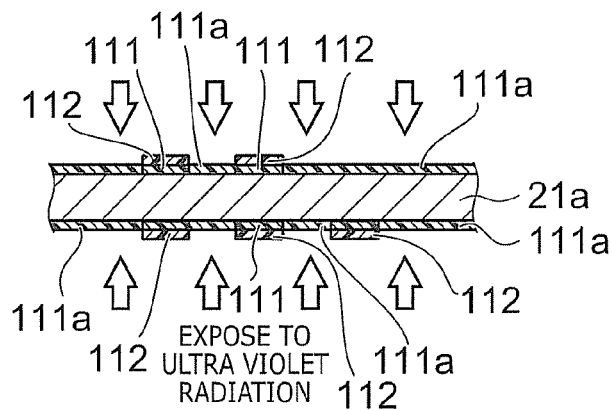
Figure 17D:
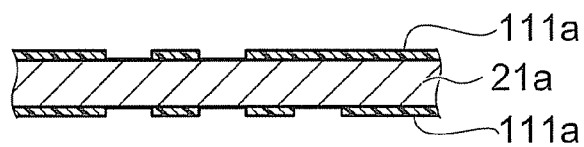
Figure 17E:
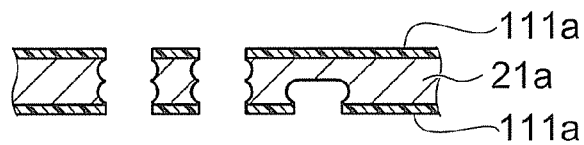
Figure 17F:
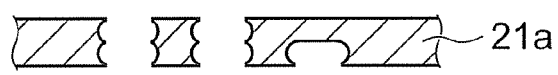
Figure 17G:
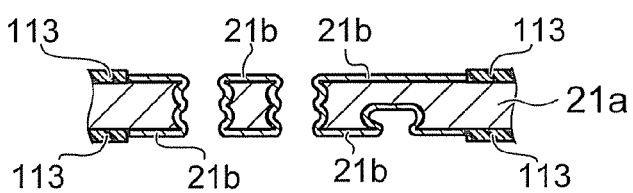
Figure 17H:
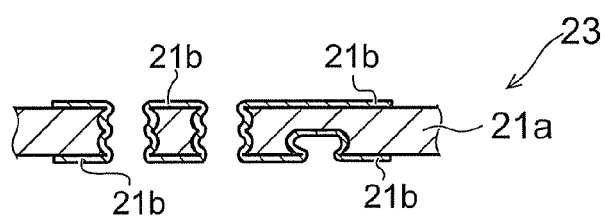

First, as shown in FIG. 17A, a copper plate 21a is prepared and then cleansed by washing. Next, as shown in FIG. 17B, resist coating is applied to both surfaces of the copper plate 21a and thereafter dried out to form resist films 111 on both surfaces thereof. Next, as shown in FIG. 17C, a mask pattern 112 is arranged on each of the resist films 111 and then exposed to ultraviolet radiation. Thereby, the exposed portions of the resist films 111 are cured, and resist patterns 111a are thus formed. Next, as shown in FIG. 17D, a development process is performed, and uncured portions of the resist films 111 are washed away. Thereby, the resist pattern 111a remains on each of the top and bottom surfaces of the copper plate 21a. Next, as shown in FIG. 17E, etching is performed using the resist patterns 111a as a mask to remove exposed portions of the copper plate 21a from both surfaces thereof. The depth of etching is set to an approximately half of the plate thickness of the copper plate 21a. Accordingly, a region subjected to etching from only one surface side is half etched, and a region subjected to etching from both surface sides penetrates through the copper plate 21a. Next, as shown in FIG. 17F, the resist patterns 111a are removed. Next, as shown in FIG. 17G, edge portions of the copper plate 21a are covered by masks 113, and plating is applied to the copper plate 21a. Thereby, silver-plated layers 21b are formed on the surface portions of the copper plate 21a other than the edge portions thereof. Next, as shown in FIG. 17H, cleansing is performed to remove the masks 113. Thereafter, an inspection is performed. In the manner described above, a lead frame sheet 23 is fabricated. The configuration according to this modification example other than the part described above, and the manufacturing method and the advantageous effects of this modification example are the same as those of the aforementioned first embodiment.

Next, a second embodiment of the invention will be described.

Figure 18:
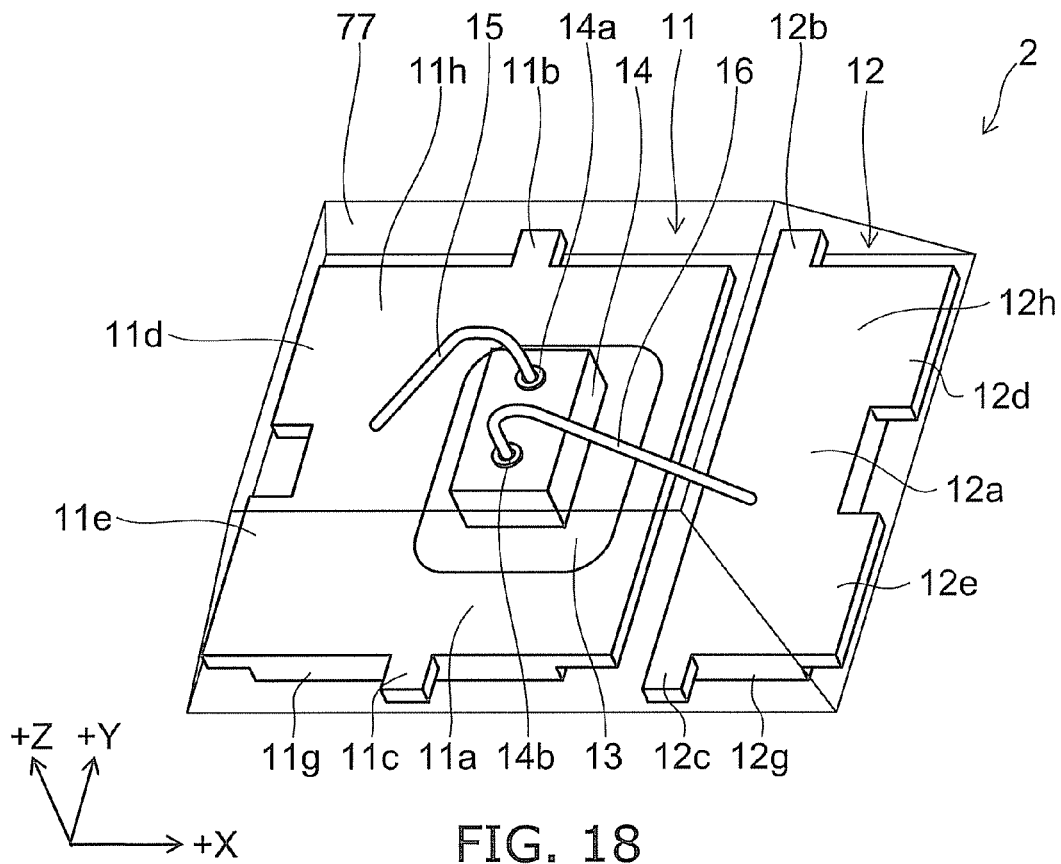
FIG. 18 is a perspective view illustrating an LED package according to a second embodiment.

FIG. 18 is a perspective view illustrating an LED package according to this embodiment.

Figure 19:
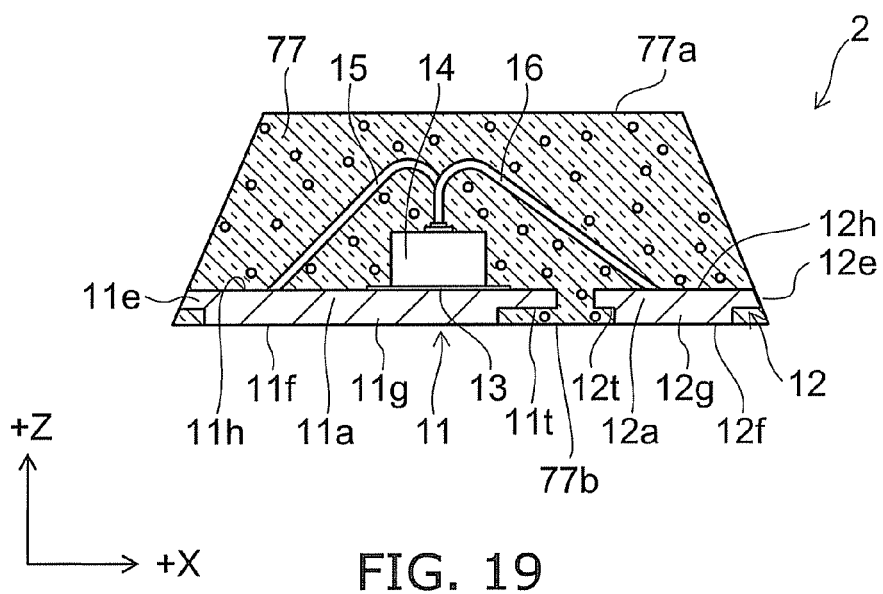
FIG. 19 is a cross-sectional view illustrating the LED package according to the second embodiment.

FIG. 19 is a cross-sectional view illustrating the LED package according to this embodiment.

As shown in FIG. 18 and FIG. 19, in an LED package 2 according to this embodiment, the shape of a transparent resin body 77 is a truncated pyramid shape. For this reason, the area of a top surface 77a of the transparent resin body 77 is smaller than the area of a bottom surface 77b thereof. In addition, the thickness of the transparent resin body 77, i.e., the length in Z direction is preferably smaller than five times of the thickness of the LED chip 14, and more preferably smaller than three times of the thickness thereof. Meanwhile, the thickness of the transparent resin body 77 needs to be larger than a thickness obtained by adding the height of a wire loop to the thicknesses of the lead frame 11 and the LED chip 14, in order to cover the apices of wire loops and thereby to surely protect the wires. Note that, in this embodiment, the chip side angle θ1 of each of the wires is larger than a corresponding one of the frame side angles θ2 as in the case of the aforementioned comparison example of the first embodiment shown in FIG. 9B. The configuration according to this embodiment other than the part described above is the same as that of the aforementioned first embodiment.

Next, a manufacturing method of an LED package according to this embodiment will be described.

Figure 20:
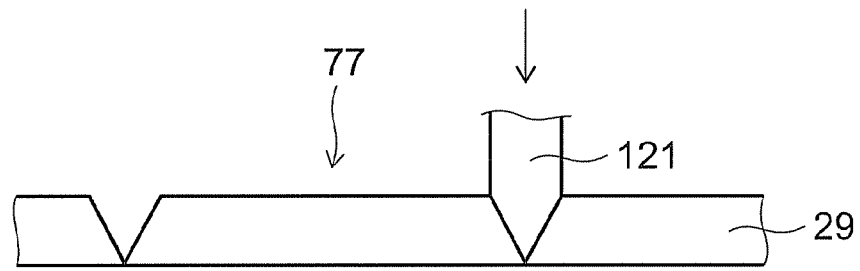
FIG. 20 is a process cross-sectional view illustrating a dicing method in the second embodiment.

FIG. 20 is a process cross-sectional view illustrating a dicing method in this embodiment.

In the manufacturing method according to this embodiment, the aforementioned processes shown in FIG. 4A to FIG. 6A, i.e., the processes in the first embodiment up to a process of forming a transparent resin plate 29 on a lead frame sheet 23 are used. In this embodiment, the dicing process is different from that of the first embodiment.

Specifically, as shown in FIG. 20, in this embodiment, a blade 121, which becomes thinner toward the tip thereof, is used to dice the transparent resin plate 29 and the lead frame sheet 23 (not shown). The cross-sectional shape of the tip of the blade 121 is a triangular shape, for example. In addition, dicing is performed from the transparent resin plate 29. Thereby, the transparent resin plate 29 is cut into the truncated pyramid transparent resin bodies 77. The processes of the manufacturing method according to this embodiment other than the process described above are the same as those of the manufacturing method according to the aforementioned first embodiment.

Next, advantageous effects of this embodiment will be described.

According to this embodiment, the transparent resin body 77 is formed in a truncated pyramid shape and formed to have a top surface whose area is smaller than the area of a bottom surface thereof. Thereby, the volume of the transparent resin body 77 can be small while the top surfaces of the lead frames 11 and 12 and the LED chip 14 as well as the wires 15 and 16 are covered by the transparent resin body 77. The strength of the thermal stress generated in the transparent resin body 77 has a positive co-relationship with the volume of the transparent resin body 77. Thus, according to this embodiment, the thermal stress to be generated in the transparent resin body 77 can be reduced while the lead frames, the LED chip and the wires are protected by transparent resin body 77. As a result, fracture of the wires due to the thermal stress of the transparent resin body can be prevented.

TEST EXAMPLE 4

Hereinafter, the aforementioned effects will be described on the basis of a test example.

Multiple LED packages according this embodiment, in each of which the transparent resin body is formed in a truncated pyramid shape, and multiple LED packages according to a comparison example, in each of which the transparent resin body is formed in a square solid shape were fabricated. The lead frames, the LED chips, the wires and the like in these LED packages were configured in the same manner shown in FIG. 18 and FIG. 19. In addition, the same thickness and resin material were used in both types of the transparent resin body. The thermal cycle test described in Test Example 1 of the first embodiment was conducted on these LED packages. The test results are shown in Table 4. As shown in Table 4, the test results indicate that the life of the LED package having a truncated pyramid transparent resin body is longer than that of the LED package having a square solid transparent resin body.

TABLE 4

|  | Shape of Transparent Resin Body | Number of Cycles at Which Defect Occurred | Improvement Rate |
| --- | --- | --- | --- |
| Embodiment | Truncated Pyramid | 800 | 1.6 |
| Comparison Example | Square Solid | 500 | 1.0 |

Note that, although the example in which the chip side angle $\theta 1$ of each of the wires is larger than a corresponding one of the frame side angles $\theta 2$ is shown in this embodiment, the chip side angles $\theta 1$ of the wires may be set smaller than the frame side angles $\theta 2$ as in the case of the first embodiment. Thereby, in addition to the effects according to this embodiment, the effects according to the first embodiment can be obtained. The advantageous effects of this embodiment other than the effects described above are the same as those of the aforementioned first embodiment.

Next, a first modification example of this embodiment will be described.

Figure 21:
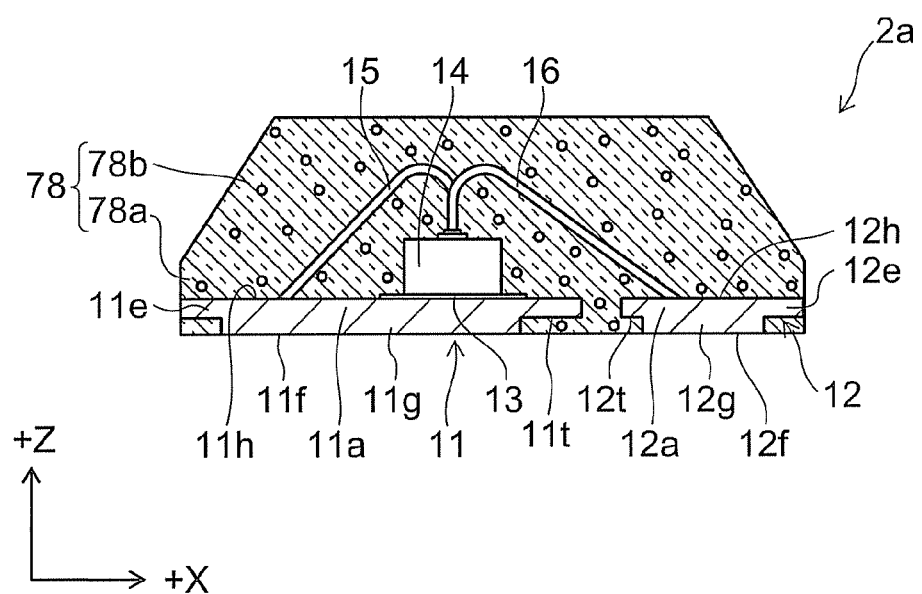
FIG. 21 is a cross-sectional view illustrating an LED package according to a first modification example of the second embodiment.

FIG. 21 is a cross-sectional view illustrating an LED package according to this modification example.

In this modification example, the shape of the transparent resin body is different as compared with the aforementioned second embodiment.

Specifically, as shown in FIG. 21, the shape of a lower portion 78a of a transparent resin body 78 is a square solid, and the shape of an upper portion 78b thereof is a truncated pyramid in an LED package 2a according to this modification example. In this case as well, the area of the top surface of the transparent resin body 78 can be smaller than the area of the bottom surface thereof. Thus, the same effects as those according to the second embodiment are obtained.

Next, a manufacturing method of the LED package according to this modification example will be described.

In this modification example, the dicing process is different from that of the aforementioned second embodiment.

FIGS. 22A to 22D are process cross-sectional views illustrating a dicing method in this modification example.

Figure 22A:
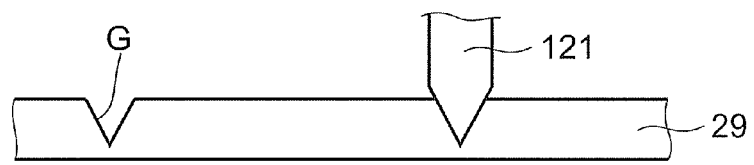
FIGS. 22A to 22D are process cross-sectional views illustrating a dicing method in the first modification example of the second embodiment.
Figure 22B:
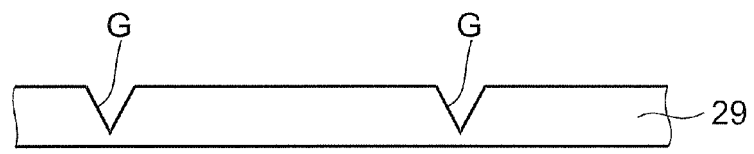

Specifically, as shown in FIG. 22A, the dicing is performed on the transparent resin plate 29 and the lead frame sheet 23 by the blade 121, which becomes thinner to the tip thereof. Dicing is performed from the transparent resin plate 29, and then stopped in the middle of the lead frame sheet 23 or the transparent resin plate 29. Thereby, as shown in FIG. 22B, a groove G whose cross-sectional shape is a reversed triangle is formed along each of the dicing regions of the transparent resin plate 29. Note that, at this stage, the transparent resin plate 29 is not cut into pieces yet.

Figure 22C:
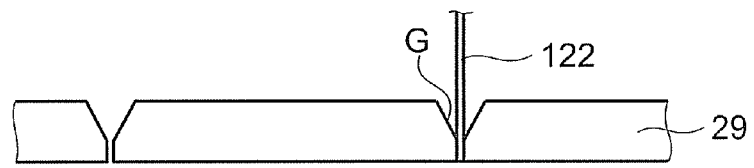
Figure 22D:
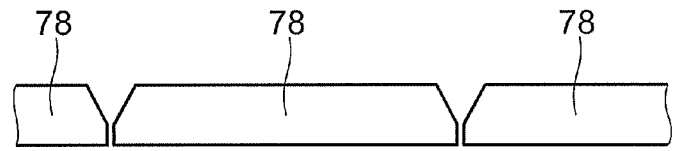

Next, as shown in FIG. 22C, dicing is further performed on a bottom portion of the groove G by use of a blade 122 having a constant thickness. Here, a blade having a width smaller than the maximum width of the blade 121 is used as the blade 122. Thereby, as shown in FIG. 22D, the transparent resin plate 29 is cut into the transparent resin bodies 78 each formed of a truncated pyramid shaped upper portion and a squared solid shaped bottom lower portion. The configuration according to this modification example other than the part described above, the manufacturing method and the advantageous effects of this modification example are the same as those of the aforementioned second embodiment.

Next, a second modification example of this embodiment will be described.

Figure 23A:
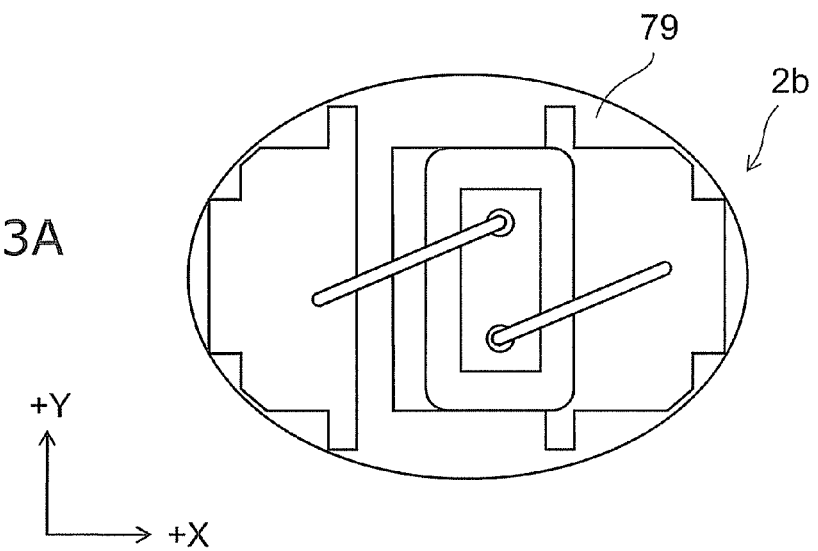
FIG. 23A is a plane view illustrating an LED package according to a second modification example of the second embodiment.
Figure 23B:
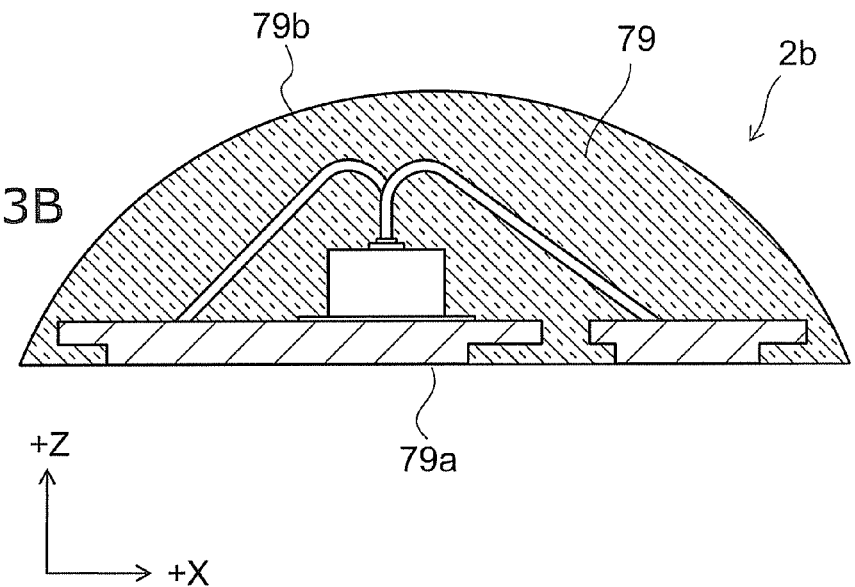
FIG. 23B is a cross-sectional view of the LED package.

FIG. 23A is a plane view illustrating an LED package according to this modification example, and FIG. 23B is a cross-sectional view of the LED package.

In this modification example, the shape of the transparent resin body is different as compared with the aforementioned second embodiment.

As shown in FIGS. 23A and 23B, in an LED package 2b according to this modification example, the shape of a transparent resin body 79 is a plane-convex shape. Specifically, the outer surface of the transparent resin body 79 is formed of a bottom surface 79a on a plane surface and a curved surface 79b positioned above the bottom surface 79a. In this case, the uppermost portion of the transparent resin body 79 is a dot shape, and the area of the top surface is thus zero. In this modification example as well, the same effects as those of the aforementioned second embodiment can be obtained.

The aforementioned transparent resin body 79 can be formed by forming a concave-lens shaped recess portion on the bottom surface of the lower mold 101 (refer to FIG. 5A) used when the transparent resin plate 29 is molded. The configuration according to this modification example other than the part described above, the manufacturing method and the advantageous effects of this modification example are the same as those of the aforementioned second embodiment.

Embodiments and modification examples thereof to be described below are variations of the aforementioned first and second embodiments. The aforementioned first embodiment may be combined with these embodiments and variations, whereby the chip side angle $\theta 1$ of each of the wires may be set smaller than a corresponding one of the frame side angles $\theta 2$. In addition, in combination with the aforementioned second embodiment, the area of the top surface of the transparent resin body may be set smaller than the area of the bottom surface thereof. Alternatively, both of the first and second embodiments may be combined with the embodiments and modification examples to be described below. Moreover, the thickness of the transparent resin body is preferably smaller than five times of the thickness of the LED chip, and more preferably smaller than three times of the thickness of the LED chip. Thereby, fracture of wires due to the thermal stress applied from the transparent resin body can be suppressed.

A third embodiment of the invention will be described.

Figure 24:
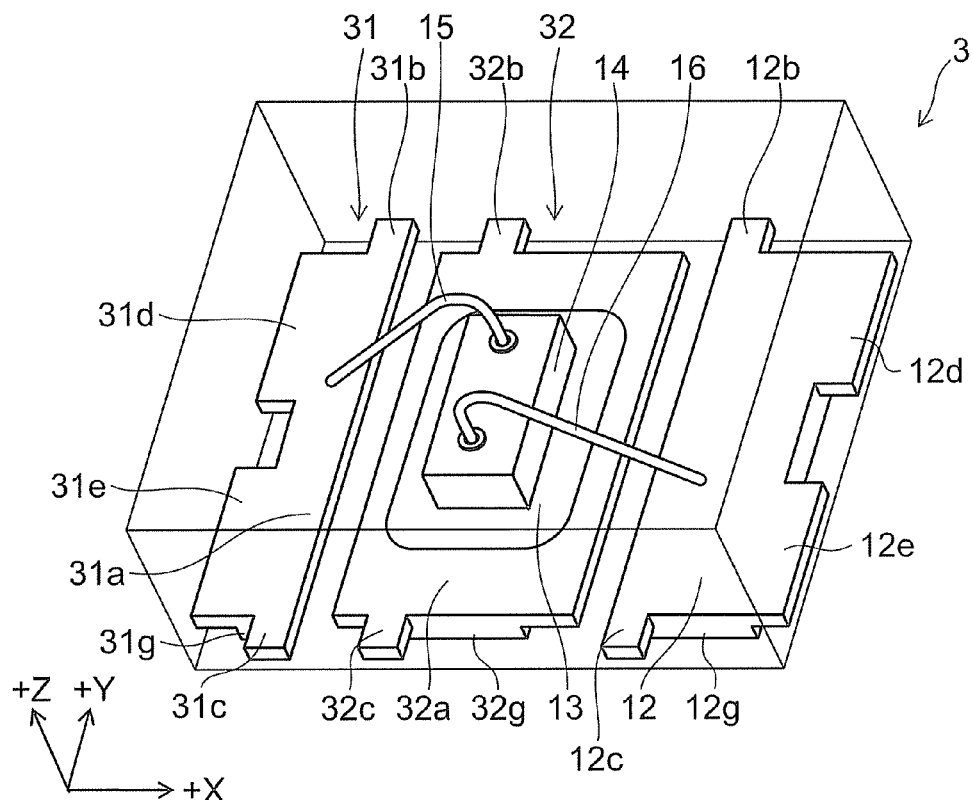
FIG. 24 is a perspective view illustrating an LED package according to a third embodiment.
Figure 25:
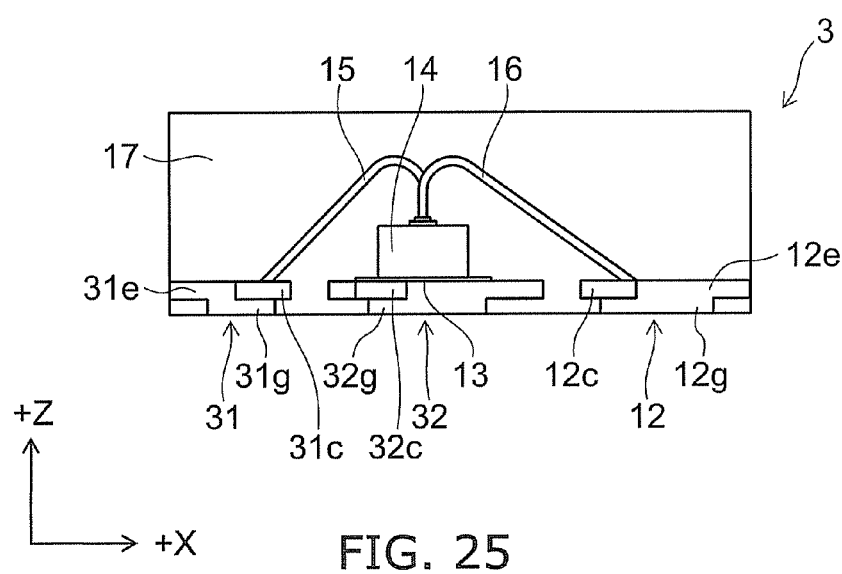
FIG. 25 is a cross-sectional view illustrating the LED package according to the third embodiment.

FIG. 24 is a perspective view illustrating an LED package according to this embodiment FIG. 25 is a cross-sectional view illustrating the LED package according to this embodiment.

As shown in FIG. 24 and FIG. 25, as compared with the LED package 1 according to the aforementioned first embodiment (refer to FIG. 1), an LED package 3 according to this embodiment is different in that the lead frame 11 (refer to FIG. 1) is divided into two lead frames 31 and 32 in X direction. The lead frame 32 is arranged between the lead frame 31 and the lead frame 12. Extending portions 31$d$ and 31$e$ corresponding to the extending portions 11$d$ and 11$e$ of the lead frame 11 (refer to FIG. 1), respectively, are formed on the lead frame 31. In addition, extending portions 31$b$ and 31$c$ extending in +Y and −Y directions, respectively, from a base portion 31$a$ are formed on the lead frame 31. The positions of the extending portions 31$b$ and 31$c$ in X direction are the same. Further, a wire 15 is bonded to the lead frame 31. Meanwhile, extending portions 32$b$ and 32$c$ corresponding to the extending portions 11$b$ and 11$c$ of the lead frame 11 (refer to FIG. 1), respectively, are formed on the lead frame 32. An LED chip 14 is mounted on the lead frame 32 via a die-mount material 13. Moreover, projected portions corresponding to the projected portion 11$g$ of the lead frame 11 are formed on the lead frames 31 and 32 as projected portions 31$g$ and 32$g$, respectively, in a divided manner.

In this embodiment, the lead frames 31 and 12 respectively serve as external electrodes by external application of an electric potential. Meanwhile, no electric potential needs to be applied to the lead frame 32, and the lead frame 32 can be used as a lead frame dedicated for heat sink. Thereby, in a case where multiple LED packages 3 are to be mounted on a single module, the lead frames 32 can be connected to a common heat sink. Note that, ground potential may be applied to the lead frame 32, and the lead frame 32 may be in a floating state. Further, when the LED package 3 is mounted on a motherboard, solder balls are respectively bonded to the lead frames 31, 32 and 12. In this manner, so called a Manhattan phenomenon can be suppressed. The Manhattan phenomenon is a phenomenon in which a device stands upright due to a gap in the timing of melting of solder balls in a reflow furnace or a surface tension of solder when a device or the like is implemented on a substrate via multiple solder balls. This phenomenon causes an implementation defect. According to this embodiment, the layouts of the lead frames are symmetrical in X direction and the solder balls are arranged closely in X direction, so that the Manhattan phenomenon is unlikely to occur.

Moreover, in this embodiment, since the lead frame 31 is supported by the extending portions 31$b$ to 31$e$ from three directions, the bondability of the wire 15 is good. Likewise, since the lead frame 12 is supported by the extending portions 12$b$ to 12$e$ from three directions, the bondability of the wire 16 is good.

The LED package 3 described above can be fabricated by the same method as that of the aforementioned first embodiment by changing the basic pattern of each of the element regions P of the lead frame sheet 23 in the process shown in FIG. 4A. Specifically, according to the aforementioned manufacturing method described in the first embodiment, it is possible to fabricate LED packages of various layouts by only changing the patterns of the masks 22$a$ and 22$b$. The configuration according to this embodiment other than the part described above, the manufacturing method and the advantageous effects of this embodiment are the same as those of the aforementioned first embodiment.

Next, a fourth embodiment of the invention will be described.

Figure 26:
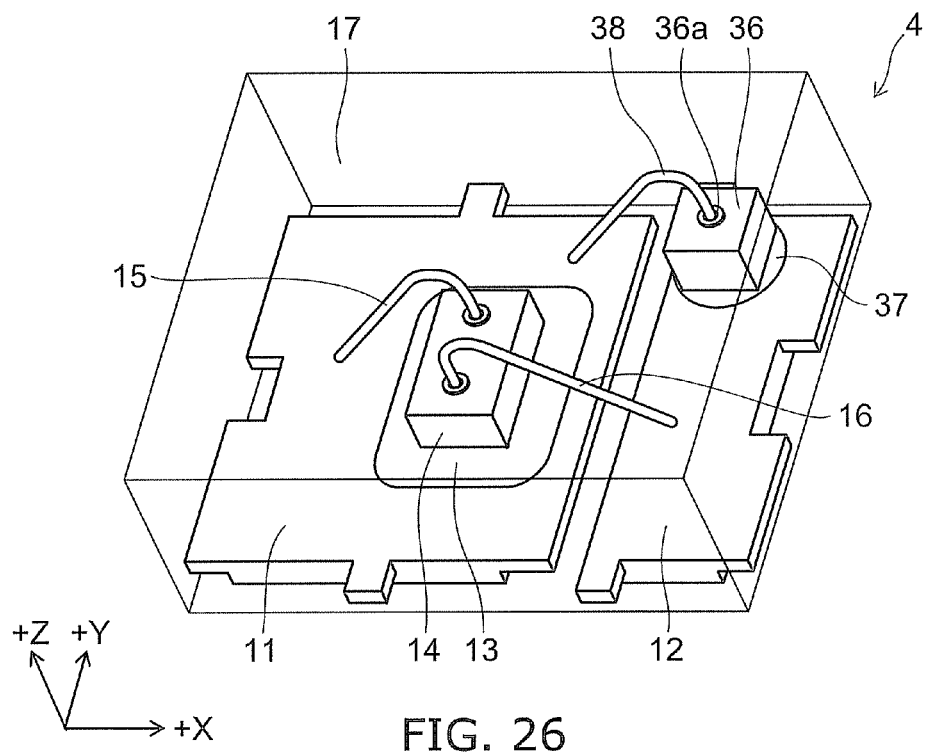
FIG. 26 is a perspective view illustrating an LED package according to a fourth embodiment.

FIG. 26 is a perspective view illustrating an LED package according to this embodiment.

Figure 27:
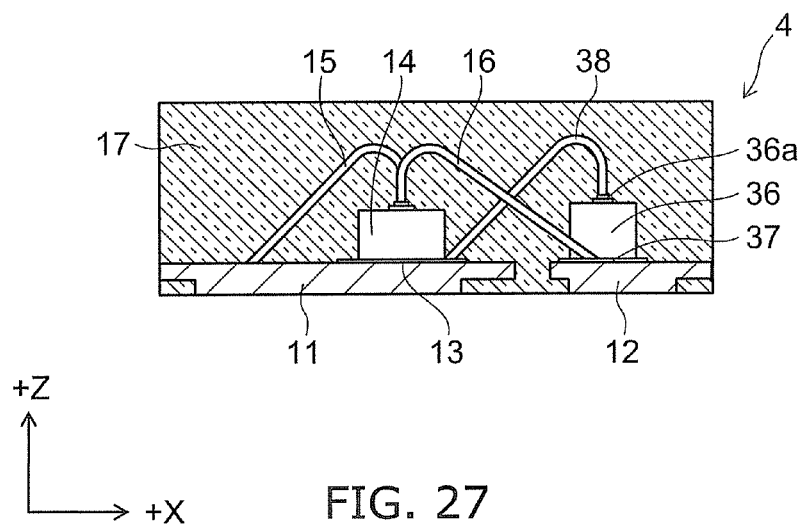
FIG. 27 is a cross-sectional view illustrating the LED package according to the fourth embodiment.

FIG. 27 is a cross-sectional view illustrating the LED package according to this embodiment.

As shown in FIG. 26 and FIG. 27, in an LED package 4 according to this embodiment, a zener diode chip 36 or the like is provided and connected between the lead frame 11 and the lead frame 12. Specifically, a die-mount material 37 formed of a conductive material such as solder or silver paste is adhered onto the top surface of the lead frame 12, and the zener diode chip 36 is provided thereon. Thereby, while the zener diode chip 36 is mounted on the lead frame 12 via the die-mount material 37, a bottom surface terminal (not shown) of the zener diode chip 36 is connected to the lead frame 12 via the die-mount material 37. In addition, a top surface terminal 36$a$ of the zener diode chip 36 is connected to the lead frame 11 through a wire 38. Specifically, one end of the wire 38 is connected to the top surface terminal 36$a$ of the zener diode chip 36, and the wire 38 is extracted from the top surface terminal 36$a$ in +Z direction and then curved in a direction between −Z direction and −X direction. The other end of the wire 38 is bonded to the top surface of the lead frame 11.

In the manner described above, the zener diode chip 36 can be connected in parallel with respect to the LED chip 14 in this embodiment. As a result, durability against ESD (Electrostatic Discharge) is improved. The configuration according to this embodiment other than the part described above, the manufacturing method and the advantageous effects of this embodiment are the same as those of the aforementioned first embodiment.

Next, a fifth embodiment of the invention will be described.

Figure 28:
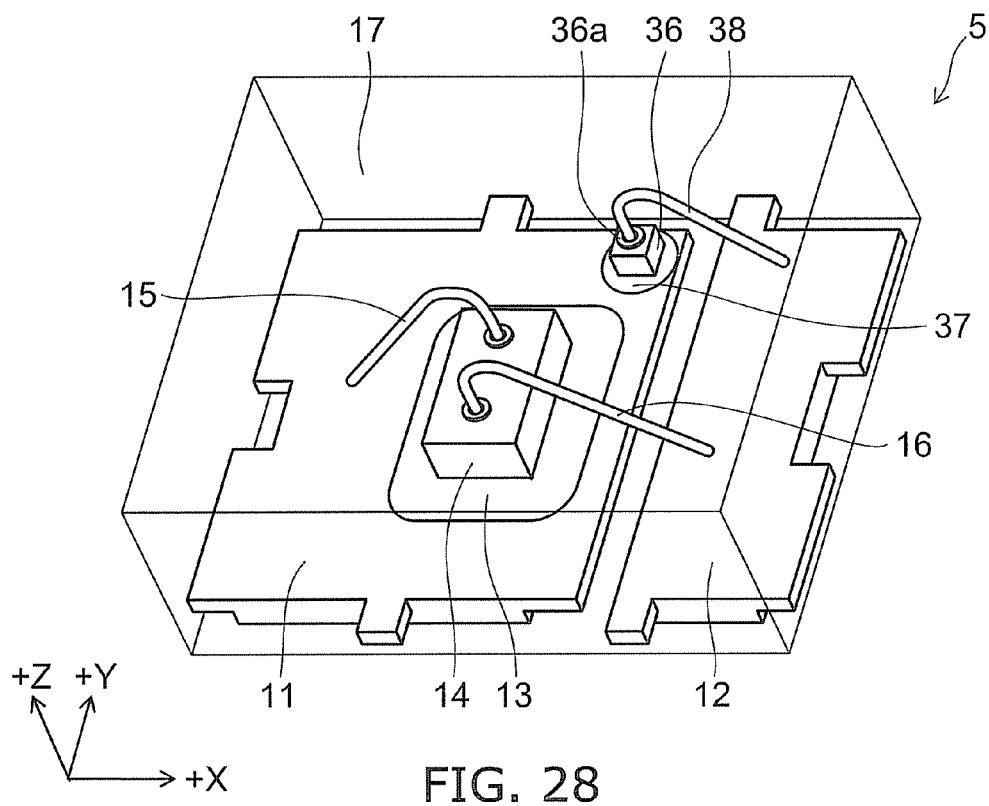
FIG. 28 is a perspective view illustrating an LED package according to a fifth embodiment.

FIG. 28 is a perspective view illustrating an LED package according to this embodiment.

Figure 29:
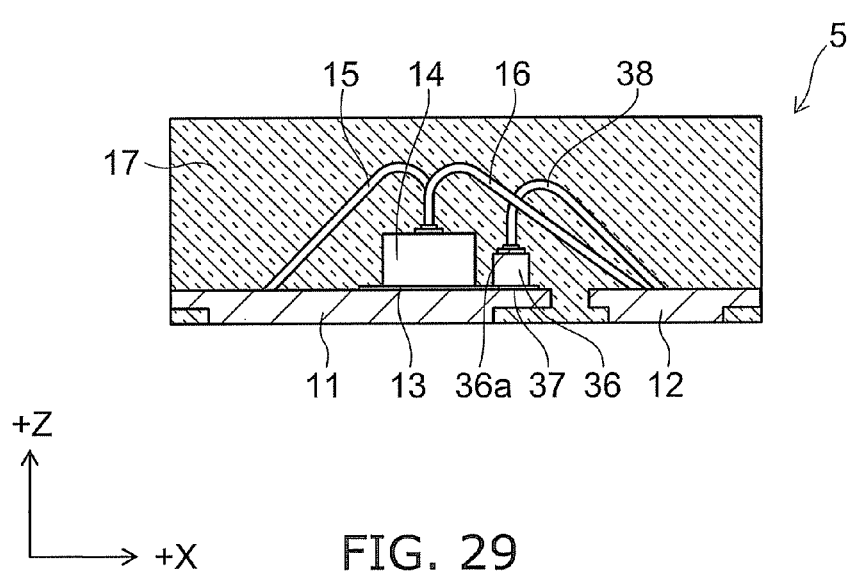
FIG. 29 is a cross-sectional view illustrating the LED package according to the fifth embodiment.

FIG. 29 is a cross-sectional view illustrating the LED package according to this embodiment.

As shown in FIG. 28 and FIG. 29, as compared with the LED package 4 according to the aforementioned fourth embodiment (refer to FIG. 26), an LED package 5 according to this embodiment is different in that the zener diode chip 36 is mounted on the lead frame 11. In this case, the bottom surface terminal of the zener diode chip 36 is connected to the lead frame 11 via the die-mount material 37, and the top surface terminal thereof is connected to the lead frame 12 through the wire 38. The configuration according to this embodiment other than the part described above, the manufacturing method and the advantageous effects of this embodiment are the same as those of the aforementioned fourth embodiment.

Next, a sixth embodiment of the invention will be described.

Figure 30:
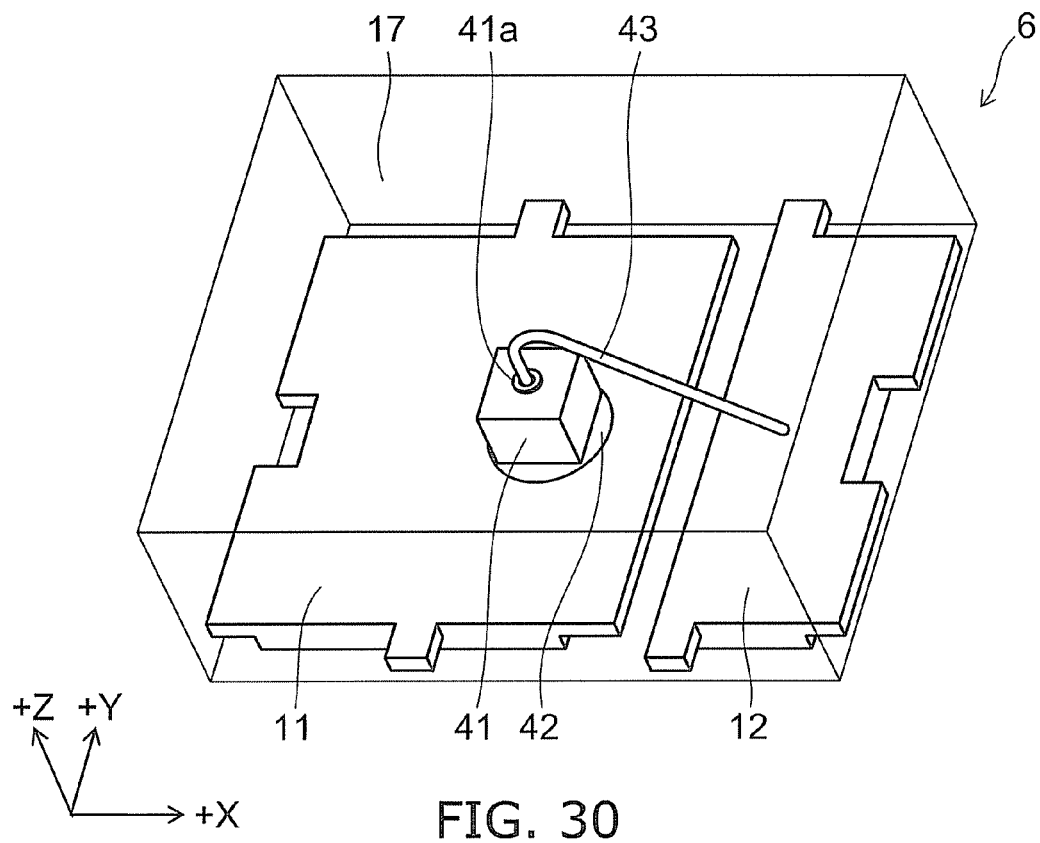
FIG. 30 is a perspective view illustrating an LED package according to a sixth embodiment.

FIG. 30 is a perspective view illustrating an LED package according to this embodiment.

Figure 31:
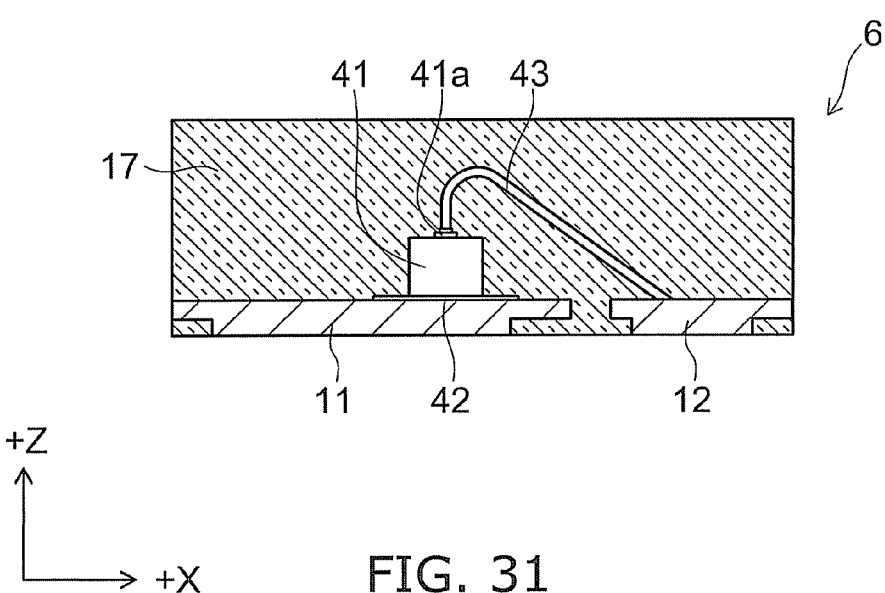
FIG. 31 is a cross-sectional view illustrating the LED package according to the sixth embodiment.

FIG. 31 is a cross-sectional view illustrating the LED package according to this embodiment.

As shown in FIG. 30 and FIG. 31, as compared with the LED package 1 according to the aforementioned first embodiment (refer to FIG. 1), an LED package 6 according to this embodiment is different in that a vertically conductive LED chip 41 is provided instead of the top surface terminal type LED chip 14. Specifically, in the LED package 6 according to this embodiment, a die-mount material 42 formed of a conductive member such as solder or silver paste is formed on the top surface of the lead frame 11, and the LED chip 41 is mounted on the lead frame 11 via the die-mount material 42. A bottom surface terminal (not shown) of the LED chip 41 is connected to the lead frame 11 via the die-mount material 42. Meanwhile, a top surface terminal 41a of the LED chip 41 is connected to the lead frame 12 through a wire 43.

In this embodiment, the vertically conductive type LED chip 41 is employed, and the number of wires is reduced to one. In this manner, it is made possible to surely prevent mutual contact of wires and also to simplify wire bonding process. The configuration according to this embodiment other than the part described above, the manufacturing method and the advantageous effects of this embodiment are the same as those of the aforementioned first embodiment.

Next, a seventh embodiment of the invention will be described.

Figure 32A:
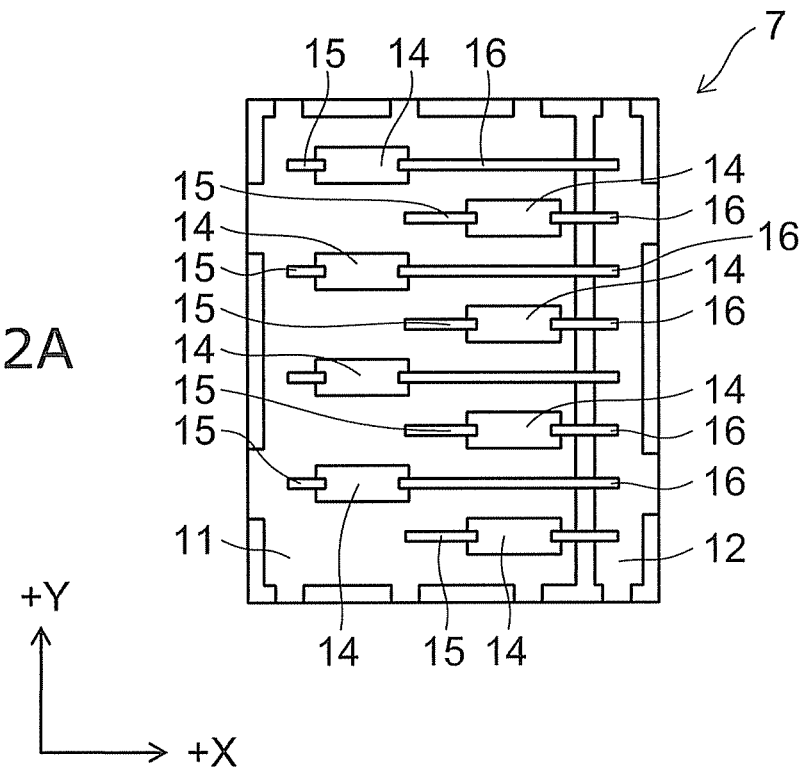
FIG. 32A is a plane view illustrating an LED package according to a seventh embodiment.
Figure 32B:
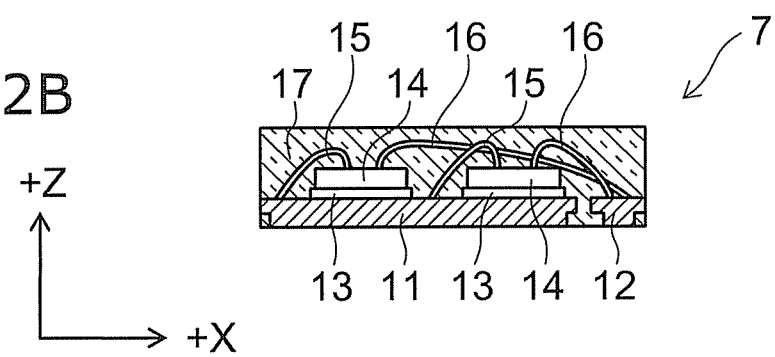
FIG. 32B is a cross-sectional view of the LED package.

FIG. 32A is a plane view illustrating an LED package according to this embodiment, and FIG. 32B is a cross-sectional view of the LED package.

As shown in FIGS. 32A and 32B, as compared with the LED package 1 according to the aforementioned first embodiment (refer to FIG. 1), an LED package 7 according to this embodiment is different in that multiple LED chips 14, e.g., eight LED chips 14 are provided. These eight LED chips 14 are compliant with the same standard and emit the same color of light.

The eight LED chips 14 are all mounted on the lead frame 11. The terminal 14a of each of the LED chips 14 (refer to FIG. 1) is connected to the lead frame 11 via the wire 15 while the terminal 14b of each of the LED chips 14 (refer to FIG. 1) is connected to the lead frame 12 via the wire 16. In this manner, the eight LED chips 14 are connected with each other in parallel between the lead frame 11 and the lead frame 12. In addition, the eight LED chips 14 are arranged in such a way that two chips are arranged along X direction and four chips are arranged along Y direction. The eight LED chips 14 are arranged in an alternate manner instead of a matrix manner. Specifically, the arrangement phase in the column formed of four LED chips 14 arranged along Y direction on the +X direction side is shifted by an approximately half cycle from the arrangement phase in the column formed of four LED chips 14 arranged along Y direction on the −X direction side.

According to this embodiment, since multiple LED chips 14 are mounted in a single LED package 7, a larger amount of light can be obtained. In addition, since the LED chips 14 are arranged in an alternate manner, while the minimum distance between the LED chips 14 is kept equal to or greater than a certain value, the LED package 7 can be small in size. In addition, since the minimum distance between the LED chips 14 is kept equal to or greater than a certain value, the possibility that light emitted from a certain LED chip 14 is absorbed by phosphors before reaching an adjacent LED chip 14 increases, so that the light extraction efficiency improves. Moreover, heat released from a certain LED chip 14 becomes unlikely to be absorbed by an adjacent LED chip 14, so that it is possible to suppress a decrease in the light emission efficiency, which is caused by a temperature rise of the LED chip 14. Furthermore, in the LED package 7 according to this embodiment, since the volume of the transparent resin body becomes large, the thermal stress also becomes large as compared with the LED package of the aforementioned third embodiment, for example, in which only one LED chip is mounted. Accordingly, when this embodiment is combined with the aforementioned first or second embodiment, the effect to reduce the influence of the thermal stress becomes particularly prominent. The configuration of this embodiment other than the part described above, the manufacturing method and the advantageous effects of this embodiment are the same as those of the aforementioned first embodiment.

Next, a first modification example of the seventh embodiment will be described.

Figure 33:
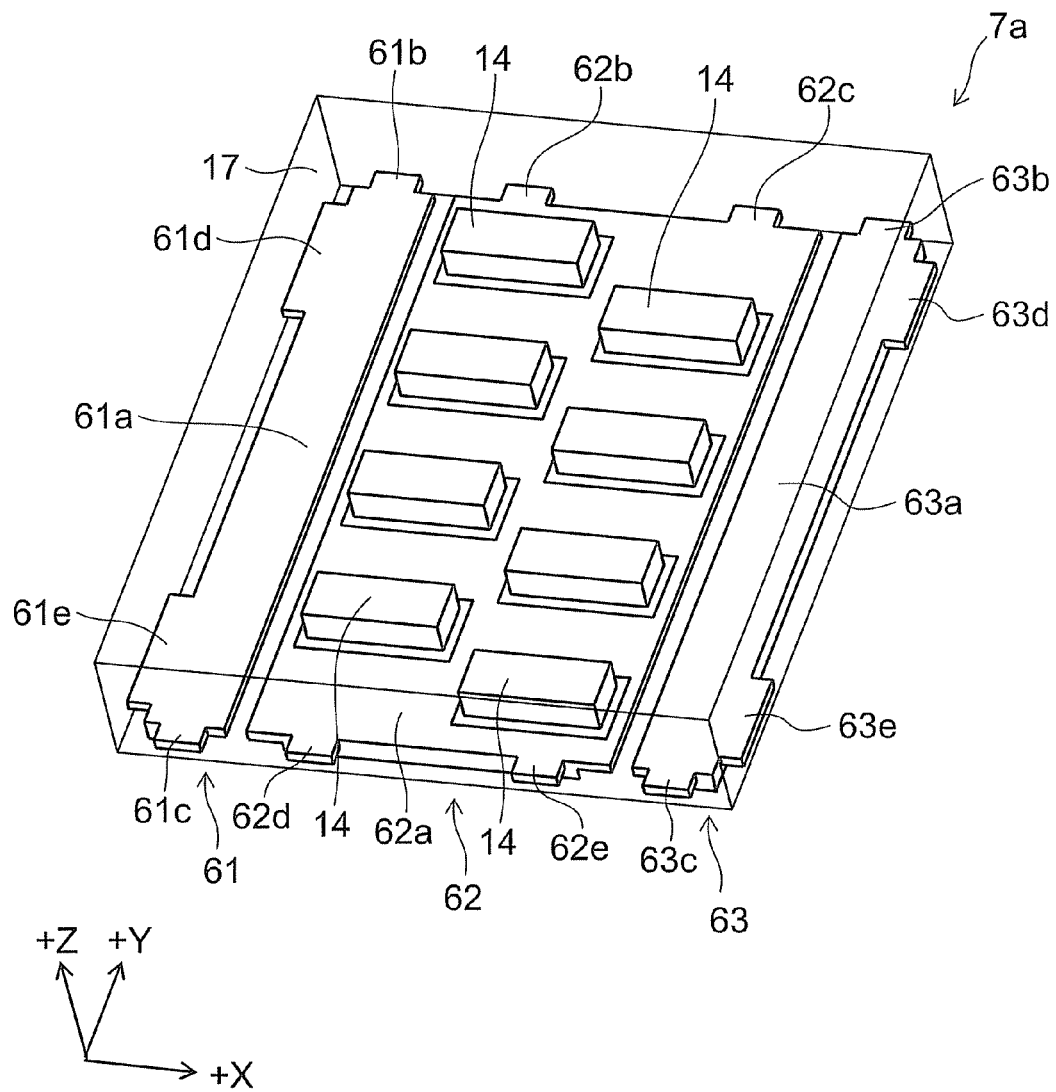
FIG. 33 is a perspective view illustrating an LED package according to a first modification example of the seventh embodiment.

FIG. 33 is a perspective view illustrating an LED package according to this modification example.

Figure 34A:
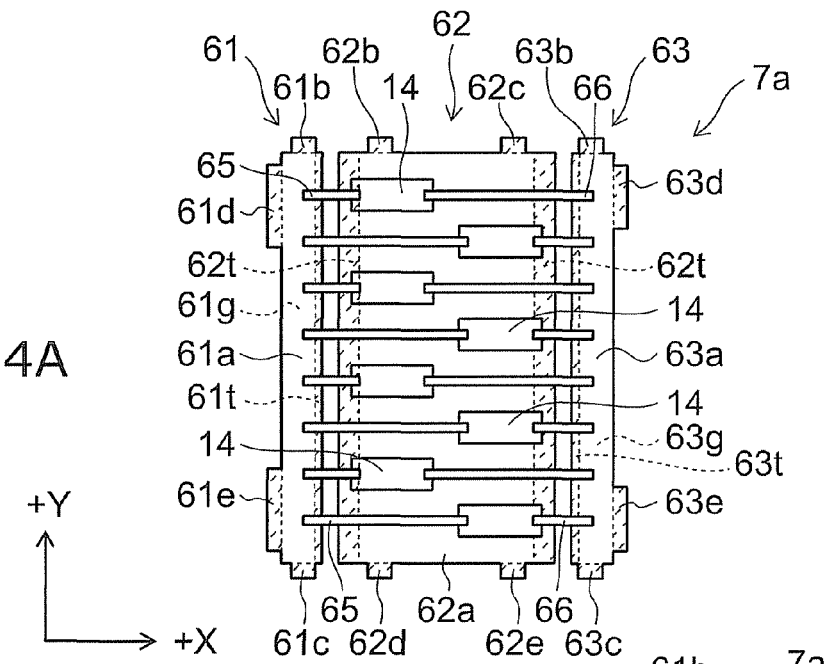
FIG. 34A is a plane view illustrating lead frames, LED chips and wires of the LED package according to the first modification example of the seventh embodiment.
Figure 34B:
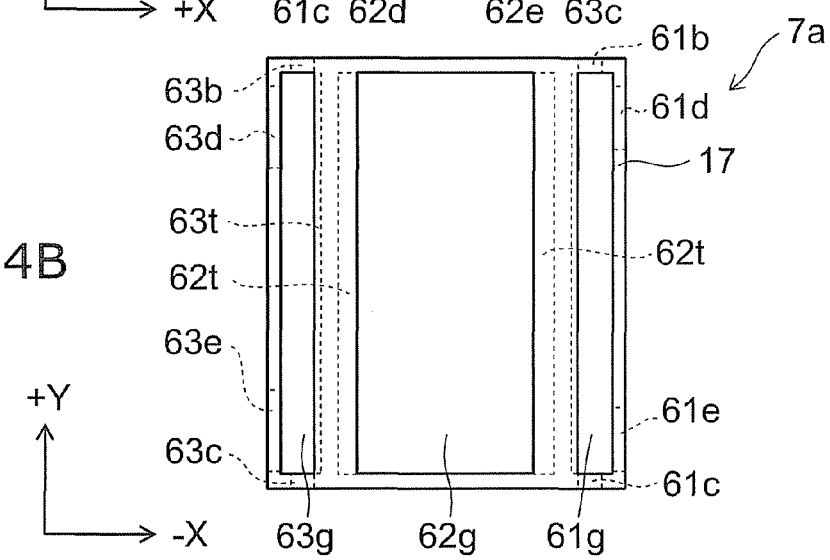
FIG. 34B is a bottom surface view illustrating the LED package.
Figure 34C:
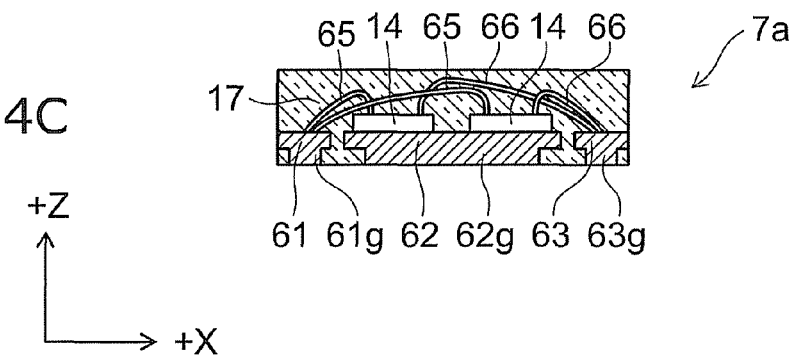
FIG. 34C is a cross-sectional view illustrating the LED package.

FIG. 34A is a plane view illustrating lead frames, LED chips and wires of the LED package according to this modification example, FIG. 34B is a bottom surface view illustrating the LED package, and FIG. 34C is a cross-sectional view illustrating the LED package.

Note that, illustration of wires is omitted in FIG. 33.

As shown in FIG. 33 and FIGS. 34A to 34C, this modification example is an example in which the aforementioned third embodiment and seventh embodiment are combined. Specifically, the three lead frames 61, 62 and 63 are provided with a space between each other in an LED package 7a according to this modification example. The configuration of each of the lead frames 61, 62 and 63 is the same as that of a corresponding one of the lead frames in the third modification example of the aforementioned first embodiment (refer to FIG. 12 to FIG. 14). In addition, multiple LED chips 14, e.g., eight LED chips 14 are provided in the LED package 7a. The arrangement state and connection state of the LED chips 14 in this modification example are the same as those in the case of the aforementioned seventh embodiment.

In this modification example as well, a large amount of light can be obtained because of provision of the eight LED chips 14 as in the case of the aforementioned seventh embodiment. In addition, through provision of the three lead frames as in the case of the aforementioned third embodiment, an electrically independent heat sink can be obtained, and also, occurrence of Manhattan phenomenon can be suppressed. Furthermore, the LED chips 14 are arranged in an alternate manner, so that a reduction in size of the LED package 7a can be achieved while the light emission efficiency and the extraction efficiency of light are secured. The configuration according to this modification example other than the part described above, the manufacturing method and the advantageous effects of this modification example are the same as those of the aforementioned third embodiment.

Next, a second modification example of the seventh embodiment will be described.

Figure 35A:
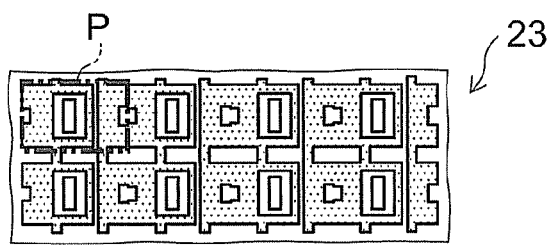
FIGS. 35A to 35E are plane views illustrating element regions of a lead frame sheet used in a second modification example of the seventh embodiment.
Figure 35B:
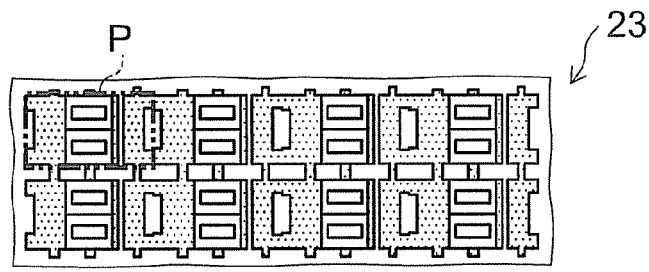
Figure 35C:
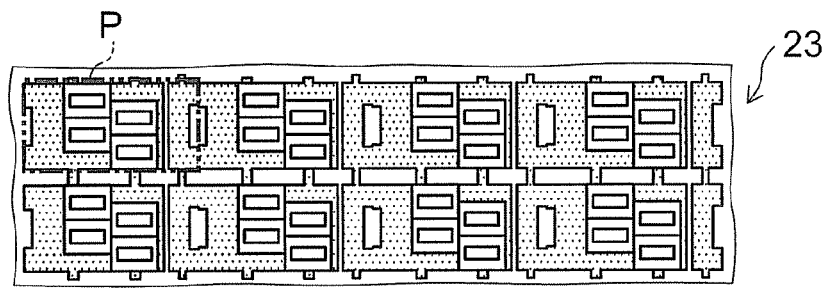
Figure 35D:
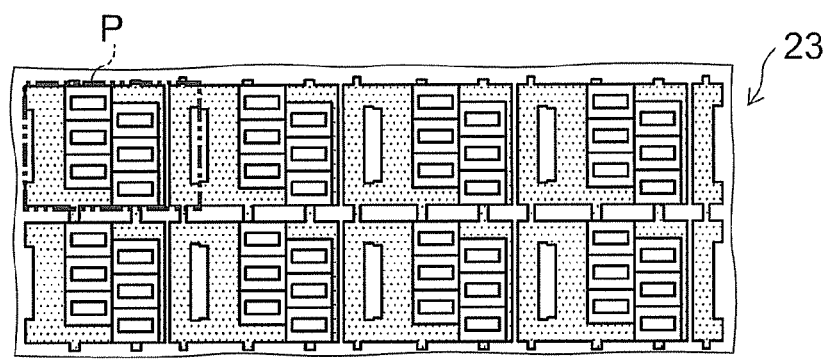
Figure 35E:
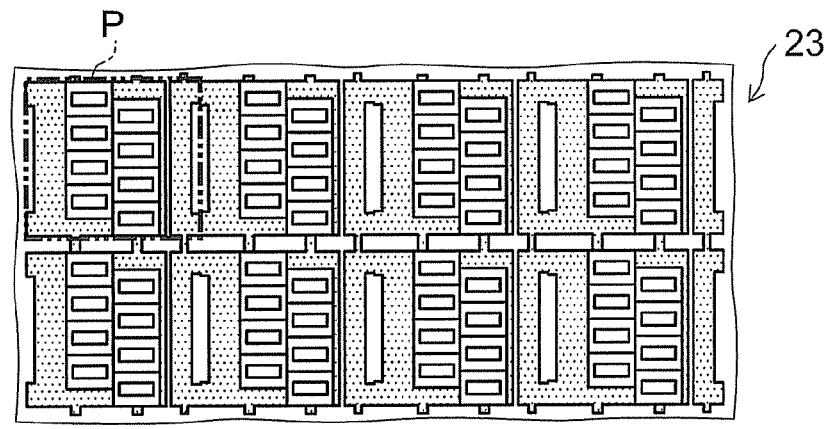

This modification example is an example of a manufacturing method of the aforementioned seventh embodiment and a modification example of the manufacturing method FIGS. 35A to 35E are plane views illustrating element regions of a lead frame sheet used in this modification example. FIG. 35A shows a case where a single LED chip is mounted in a single LED package. FIG. 35B shows a case where two LED chips are mounted in a single LED package. FIG. 35C shows a case where four LED chips are mounted in a single LED package. FIG. 35D shows a case where six LED chips are mounted in a single LED package. FIG. 35E shows a case where eight LED chips are mounted in a single LED package.

Note that, the diagrams in FIGS. 35A to 35E are drawn to the same reduced scale. In addition, although only one element region P is drawn in each of the diagrams, actually, a large number of element regions P are arranged in a matrix. Further, illustration of the dicing region D is omitted.

As shown in FIGS. 35A to 35E, the greater the number of LED chips to be mounted on a single LED package, the larger the area of a single element region P, and the fewer the number of element regions P to be included in a single block B. However, even when the number of LED chips is changed, the basic structure of the lead frame sheet 23, i.e., the size of the lead frame sheet 23, the arrangement of the blocks B and the like are the same. In addition, the formation method of the lead frame sheet 23 is the same, and the manufacturing method of the LED package using the lead frame sheet 23 is the same, but only the layout in the block B changes.

As described above, according to this modification example, the LED packages according to the aforementioned seventh embodiment and the modification examples thereof can be manufactured separately by only changing the layout in each blocks B in the lead frame sheet 23. Note that, the number of LED chips to be mounted in a single LED package is arbitrarily. Thus, seven or nine or more LED chips may be mounted in a single LED package, for example.

Hereinabove, the invention has been described with reference to embodiments and modification examples thereof. However, the invention is not limited to these embodiments and modification examples thereof. The aforementioned embodiments and modification examples thereof can be implemented in combination with each other. In addition, the scope of the invention includes an embodiment obtained by adding or deleting a constituent element or changing a design, or an embodiment obtained by adding or omitting a process or changing a condition with respect to each of the aforementioned embodiments and the modification examples thereof by a person skilled in the art, as appropriate, as long as the embodiment has the gist of the invention.

For example, although an example of a case where wet etching is used to form the lead frame sheet 23 is shown in the aforementioned first embodiment, the invention is not limited to this case, and a mechanical technique such as pressing may be used to form the lead frame sheet 23, for example. In addition, although an example of a case where sliver plated layers are formed respectively on the top and bottom surfaces of a copper plate of a lead frame is shown in the aforementioned first embodiment, the invention is not limited to this case. For example, sliver plated layers are formed respectively on the top and bottom surfaces of a copper layer, first, and then, a rhodium (Rh) plated layer may be formed on any one of the silver-plated layers. In addition, a copper (Cu) plated layer may be formed between a silver-plated layer and a copper layer. Furthermore, nickel (Ni) plated layers may be formed respectively on the top and bottom surfaces of a copper layer, and a metal alloy (Au—Ag alloy) plated layer formed of gold and silver may be formed on one or both of the nickel plated layers. Moreover, in each of the aforementioned embodiments, an example of a case where the main body of the lead frame is formed of a conductive member such as copper is shown. However, when the lead frame is coated by a plating layer having conductivity such as silver-plating, since electrical continuity can be ensured by this plating layer, the main body of the lead frame is not necessarily formed of a conducive member, and may be formed of an insulating member.

In addition, in each of the aforementioned embodiments and the modification examples thereof, the following example of a case is shown: a chip emitting blue light is used as the LED chip; a phosphor absorbing blue light and emitting yellow light is used as the phosphor; and the color of light emitted from the LED package is white. However, the invention is not limited to this case. The LED chip may be an LED chip emitting color of visible light other than blue, and may be one that emits ultraviolet or infrared light. Further, the phosphor is not limited to a phosphor emitting yellow light. For example, a phosphor emitting blue light, green light or red light may be employed.

As a phosphor emitting blue light, the following can be cited, for example.

$(RE_{1-x}Sm_x)_3(Al_yGa_{1-y})_5O_{12}$: Ce, provided that $0 \leqq x<1$, $0 \leqq y \leqq 1$, and RE is at least one element selected from the group of Y and Gd.

ZnS: Ag
ZnS: Ag+Pigment
ZnS: Ag, Al
ZnS: Ag, Cu, Ga, Cl
ZnS: Ag +$In_2O_3$
ZnS: Zn+$In_2O_3$
(Ba, Eu)$MgAl_{10}O_{17}$
(Sr, Ca, Ba, Mg)$_{10}(PO_4)_6Cl_2$: Eu
$Sr_{10}(PO_4)_6Cl_2$: Eu
(Ba, Sr, Eu)(Mg, Mn)$Al_{10}O_{17}$
10(Sr, Ca, Ba, Eu).6$PO_4.Cl_2$
$BaMg_2Al_{16}O_{25}$: Eu As a phosphor emitting green light other than the aforementioned sialon green phosphor, the following can be cited, for example.

ZnS: Cu, Al
ZnS: Cu, Al+Pigment
(Zn, Cd) S: Cu, Al
ZnS: Cu, Au, Al+Pigment
$Y_3Al_5O_{12}$: Tb
$Y_3(Al, Ga)_5O_{12}$: Tb
$Y_2SiO_5$: Tb
$Zn_2SiO_4$: Mn
(Zn, Cd)S: Cu
ZnS: Cu
ZnS: Cu+$Zn_2SiO_4$: Mn
$Gd_2O_2S$: Tb
(Zn, Cd)S: Ag
$Y_2O_2S$: Tb
ZnS: Cu, Al+$In_2O_3$
(Zn, Cd) S: Ag+$In_2O_3$
(Zn, Mn)$_2SiO_4$
$BaAl_{12}O_{19}$: Mn
(Ba, Sr, Mg)O.a$Al_2O_3$: Mn
$LaPO_4$: Ce, Tb
3(Ba, Mg, Eu, Mn)O.8$Al_2O_3$
$La_2O_3$.0.2$SiO_2$.0.9$P_2O_5$: Ce, Tb
$CeMgAl_{11}O_{19}$: Tb As a phosphor emitting red light other than the aforementioned sialon red phosphor, the following can be used, for example.

$CaAlSiN_3$: $Eu^{2+}$
$Y_2O_2S$: Eu
$Y_2O_2S$: Eu+Pigment
$Y_2O_3$: Eu
$Zn_3(PO_4)_2$: Mn
(Zn, Cd) S: Ag+$In_2O_3$
(Y, Gd, Eu)$BO_3$
(Y, Gd, Eu)$_2O_3$
$YVO_4$: Eu
$La_2O_2S$: Eu, Sm As a phosphor emitting yellow light other than the aforementioned silicate phosphor, the following can be used, for example: a phosphor which is expressed by a general expression: $Me_xSi_{12-(m+n)}Al_{(m+n)}O_nN_{16-n}$:$Re1_yRe2_z$ (provided that x, y, z, m and n in the expression are coefficients), and whose part of or all of metal Me (Me is one or two elements of Ca and Y) melting with alpha sialon is replaced with lanthanide metal Re1 (Re1 is one or more elements of Pr, Eu, Tb, Yb and Er) serving as the center of light emission or two of lanthanide metal Re1 and Re2 (Re2 is Dy) serving as a co-activator.

Moreover, the color of light emitted from the entire LED package is not limited to white. Any color tone can be achieved by adjusting an R:G:B weight ratio of the aforementioned red phosphor, green phosphor and blue phosphor. For example, white light emission from white lamp color to white fluorescent color can be achieved by using any one of the following R:G:B ratios: 1:1:1 to 7:1:1 and 1:1:1 to 1:3:1, and 1:1:1 to 1:1:3.

Furthermore, a phosphor may not be provided in the LED package. In this case, the light emitted from the LED chip is emitted from the LED package.

In addition, an example of a case where the shape of the base portion of a lead frame is rectangular when viewed from above is shown in each of the aforementioned embodiments and the modification examples thereof. However, the shape of the base portion may be one from which at least one corner portion is removed. In this case, a right angle or sharp angle portion is removed from a near corner portion of the LED package. Thus, such a corner portion does not become the origin of peeling or crack of resin. As a result, it is possible to suppress occurrence of peeling or crack of resin for the entire LED package.

According to the embodiments described above, an LED package with a high durability and low cost, and a manufacturing method of the same can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

The invention claimed is:

1. An LED package comprising:
a first lead frame and a second lead frame arranged on a same plane with a space between each other;
a first LED chip and a second LED chip provided above the first lead frame and the second lead frame, each of the first LED chip and the second LED chip having a first terminal connected to the first lead frame and a second terminal connected to the second lead frame;
a first wire connecting the first terminal of the first LED chip to the first lead frame;
a second wire connecting the first terminal of the second LED chip to the first lead frame; and
a resin body covering the first LED chip and the second LED chip as well as a top surface, a part of a bottom surface, and a part of an edge surface of each of the first lead frame and the second lead frame, a remaining portion of each of the bottom surfaces and a remaining portion of each of the edge surfaces being exposed,
a shape of the resin body being rectangular seen from above,
a first chip side angle formed by a top surface of the first LED chip and a direction in which the first wire is extracted from the first terminal of the first LED chip being smaller than a first frame side angle formed by the top surface of the first lead frame and a direction in which the first wire is extracted from the first lead frame,
a second chip side angle formed by a top surface of the second LED chip and a direction in which the second wire is extracted from the first terminal of the second LED chip being smaller than a second frame side angle formed by the top surface of the first lead frame and a direction in which the second wire is extracted from the first lead frame,
a first middle portion other than the both ends of the first wire being arranged at a position outside a region immediately above a first straight line connecting the both ends of the first wire,
a second middle portion other than the both ends of the second wire being arranged at a position outside a region immediately above a second straight line connecting the both ends of the second wire,
the first LED chip and the second LED chip being arranged at positions separated from a center portion of the resin body in mutually opposite longitudinal direction of the resin body,
the first middle portion being displaced in a first direction toward the center portion of the longitudinal direction from the region immediately above the first straight line, and
the second middle portion being displaced in a second direction toward the center portion of the longitudinal direction from the region immediately above the second straight line.

2. The LED package according to claim 1, wherein the first middle portion is substantially positioned within a region between extension surfaces of two side surfaces extending in a direction from the first terminal to the second terminal in the first LED chip,
the second middle portion is substantially positioned within a region between extension surfaces of two side surfaces extending in a direction from the first terminal to the second terminal in the second LED chip.

3. The LED package according to claim 1, wherein the first chip side angle and the second chip side angle are substantially between 0° and 5°, and the first frame side angle and the second frame side angle are substantially between 85° and 90°.

4. The LED package according to claim 1, further comprising a third wire connecting the second terminal of the first LED chip to the second lead frame; and
a fourth wire connecting the second terminal of the second LED chip to the second lead frame,
a third chip side angle formed by the top surface of the first LED chip and a direction in which the third wire is extracted from the second terminal of the first LED chip being smaller than a third frame side angle formed by the top surface of the second lead frame and a direction in which the third wire is extracted from the second lead frame,
a fourth chip side angle formed by the top surface of the second LED chip and a direction in which the fourth wire is extracted from the second terminal of the second LED chip being smaller than a fourth frame side angle formed by the top surface of the second lead frame and a direction in which the fourth wire is extracted from the second lead frame.

5. The LED package according to claim 1, wherein bumps are formed at a bonding portion between the first terminal and the first wire, a bonding portion between the first terminal of the second LED chip and the second wire, a bonding portion between the first lead frame and the first wire, and a bonding portion between the first lead frame and the second wire.

6. The LED package according to claim 1, wherein a thickness of the resin body in a vertical direction is smaller than five times of a thickness of the first LED chip, and is larger than a thickness obtained by adding a height of loop of the first wire to a thickness of the first lead frame and the thickness of the first LED chip.

7. The LED package according to claim 1, wherein
projected portions are formed on the bottom surface of the first lead frame and the bottom surface of the second lead frame, and
bottom surfaces of the projected portions are exposed on the bottom surface of the resin body, and side surfaces of the projected portions are covered by the resin body.

8. The LED package according to claim 7, wherein
the first lead frame has a first edge, the second lead frame has a second edge, the first edge and the second edge face each other, the first projected portion is formed in a region being apart from the first edge, and the second projected portion is formed in a region being apart from the second edge.

9. The LED package according to claim 1, wherein at least one of the first lead frame and the second lead frame includes:
a base portion; and
three extending portions extending from the base portion in mutually different directions and having bottom surfaces covered by the resin body and edge surfaces exposed on side surfaces of the resin body,
edge surfaces of the base portion being covered by the resin body.

10. The LED package according to claim 1, wherein
one of the first lead frame and the second lead frame includes:
a base portion having edge surfaces covered by the resin body; and
a plurality of extending portions extending from the base portion in different directions and having bottom surfaces covered by the resin body and edge surfaces exposed on different three side surfaces of the resin body.

11. The LED package according to claim 1, further comprising a third lead frame arranged between the first lead frame and the second lead frame, the first LED chip and the second LED chip being mounted on the third lead frame, and a part of a bottom surface of the third lead frame and a part of an edge surface of the third lead frame being exposed from the resin body.

* * * * *